(12) United States Patent
Lohn et al.

(10) Patent No.: US 9,412,446 B1
(45) Date of Patent: Aug. 9, 2016

(54) MULTILEVEL RESISTIVE INFORMATION STORAGE AND RETRIEVAL

(71) Applicant: Sandia Corporation, Albuquerque, NM (US)

(72) Inventors: Andrew Lohn, Albuquerque, NM (US); Patrick R. Mickel, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 109 days.

(21) Appl. No.: 14/462,472

(22) Filed: Aug. 18, 2014

Related U.S. Application Data

(60) Provisional application No. 61/866,690, filed on Aug. 16, 2013.

(51) Int. Cl.
G11C 13/00 (2006.01)

(52) U.S. Cl.
CPC .................. G11C 13/0069 (2013.01)

(58) Field of Classification Search
USPC .......................................... 365/148
See application file for complete search history.

(56) References Cited

U.S. PATENT DOCUMENTS

| | | | |
|---|---|---|---|
| 7,129,133 B1 | 10/2006 | Avanzino et al. | |
| 8,249,838 B2 | 8/2012 | Pino et al. | |
| 8,395,926 B2 | 3/2013 | Kreupl et al. | |
| 8,450,711 B2 | 5/2013 | Williams et al. | |
| 8,835,272 B1 | 9/2014 | Mickel et al. | |
| 8,872,246 B1 | 10/2014 | Stevens et al. | |
| 2008/0101110 A1* | 5/2008 | Happ ................. | G11C 11/5678 365/163 |
| 2010/0108975 A1* | 5/2010 | Sun ...................... | H01L 45/1233 257/4 |
| 2010/0193762 A1* | 8/2010 | Hsieh .................... | H04L 45/085 257/4 |
| 2010/0321980 A1* | 12/2010 | Fujita .................... | G11C 11/16 365/148 |
| 2011/0103150 A1* | 5/2011 | Chan .................. | G11C 16/0483 365/185.19 |
| 2011/0169136 A1 | 7/2011 | Pickett et al. | |
| 2012/0104347 A1 | 5/2012 | Quick | |
| 2013/0248809 A1* | 9/2013 | Tamai ................... | H01L 45/126 257/4 |
| 2014/0027705 A1 | 1/2014 | Yang et al. | |
| 2014/0264238 A1* | 9/2014 | Jo .......................... | H01L 45/08 257/4 |
| 2014/0268998 A1* | 9/2014 | Jo .......................... | H01L 45/16 365/148 |
| 2014/0291598 A1* | 10/2014 | Hwang ............... | H01L 45/1266 257/2 |
| 2014/0293678 A1* | 10/2014 | Orlowski ............... | H01L 45/08 365/148 |
| 2015/0003144 A1* | 1/2015 | Eleftheriou ........ | G11C 11/5614 365/148 |
| 2015/0016178 A1* | 1/2015 | Nardi ...................... | H01L 45/08 365/148 |

OTHER PUBLICATIONS

Abdalla H et al., "SPICE modeling of memristors," *IEEE Int'l Symp. on Circuits and Systems*, held on May 15-18, 2011 in Rio de Janeiro, pp. 1832-1835.
Biolek Z et al., "SPICE model of memristor with nonlinear dopant drift," *Radioengineering* Jun. 2009;18(2):210-4.

(Continued)

*Primary Examiner* — Min Huang
(74) *Attorney, Agent, or Firm* — Aman Talwar

(57) ABSTRACT

The present invention relates to resistive random-access memory (RRAM or ReRAM) systems, as well as methods of employing multiple state variables to form degenerate states in such memory systems. The methods herein allow for precise write and read steps to form multiple state variables, and these steps can be performed electrically. Such an approach allows for multilevel, high density memory systems with enhanced information storage capacity and simplified information retrieval.

20 Claims, 10 Drawing Sheets

(56) References Cited

OTHER PUBLICATIONS

Brumbach MT et al., "Evaluating tantalum oxide stoichiometry and oxidation states for optimal memristor performance," *J. Vac. Sci. Technol. A* 2014;32(5):051403 (7 pp.).
Cabrera N. et al., "Theory of the oxidation of metals," *Rep. Prog. Phys.* 1949;12:163-84.
Duan L et al., "Periodicity and dissipativity for memristor-based mixed time-varying delayed neural networks via differential inclusions," *Neural Networks* Sep. 2014;57:12-22.
Gao L et al., "Programmable CMOS/memristor threshold logic," *IEEE Trans. Nanotechnol.* Jan. 2013;12(2):115-9.
Hopkins PE, "Thermal transport across solid interfaces with nanoscale imperfections: Effects of roughness, disorder, dislocations, and bonding on thermal boundary conductance," *ISRN Mech. Eng.* 2013:682586 (19 pp.).
Ju SH et al., "Investigation on interfacial thermal resistance and phonon scattering at twist boundary of silicon," *J. Appl. Phys.* 2013;113:053513 (7 pp.).
Kim KH et al., "A functional hybrid memristor crossbar-array/CMOS system for data storage and neuromorphic applications," *Nano Lett.* 2012;12:389-95.
Kvatinsky S et al., "TEAM: ThrEshold adaptive memristor model," *IEEE Trans. Circuits Syst.* Jan. 2013;60(1):211-21.
Lee HY et al., "Low power and high speed bipolar switching with a thin reactive Ti buffer layer in robust $HfO_2$ based RRAM," *IEEE Int'l Electron Devices Meeting (IEDM)*, held on Dec. 15-17, 2008, in San Francisco, CA (pp. 1-4).
Li H et al., "A SPICE model of resistive random access memory for large-scale memory array simulation," *IEEE Electron Device Lett.* Feb. 2014;35(2):211-3.
Linn E et al., "Complementary resistive switches for passive nanocrossbar memories," *Nat. Mater.* 2010;9:403-6.
Lohn AJ et al., "Degenerate resistive switching and ultrahigh density storage in resistive memory," *Appl. Phys. Lett.* 2014;105:103501 (2014) (5 pp.).
Lohn AJ et al., "Memristors as synapses in artificial neural networks: Biomimicry beyond weight change," Chapter 9, *Cybersecurity Systems for Human Cognition Augmentation*, RE Pino et al. (eds.), Springer Int'l Publishing, Switzerland, 2014, pp. 135-150.
Lohn AJ et al., "Modeling of filamentary resistive memory by concentric cylinders with variable conductivity," *Appl. Phys. Lett.* 2014;105:183511 (5 pp.).
Pershin YV et al., "Experimental demonstration of associative memory with memristive neural networks," *Neural Networks* 2010;23:881-6.
Radwan AG et al., "HP memristor mathematical model for periodic signals and DC," *IEEE Int'l Midwest Symp. on Circuits and Systems*, held on Aug. 1-4, 2010 in Seattle, WA, pp. 861-864.
Rajendran J et al., "An energy-efficient memristive threshold logic circuit," *IEEE Trans. Comput.* Apr. 2012;61(4):474-87.
Savchenko IV et al., "Thermal conductivity and thermal diffusivity of tantalum in the temperature range from 293 to 1800 K," *Thermophys. Aeromech.* Dec. 2008;15(4):679-82.
Stranz A et al., "Thermoelectric properties of high-doped silicon from room temperature to 900 K," *J. Electron. Mater.* Jul. 2013;42(7):2381-7.
Taylor RE et al., "Thermal conductivity of titanium carbide, zirconium carbide and titanium nitride at high temperatures," *J. Am. Ceram. Soc.* Feb. 1964;47(2):69-73.
Wong HSP et al., "Metal-oxide RRAM," *Proc. IEEE* Jun. 2012;100(6):1951-70.
Yang JJ et al., "Engineering nonlinearity into memristors for passive crossbar applications," *Appl. Phys. Lett.* 2012;100:113501 (4 pp.).
Zhang Z et al., "Nanometer-scale $HfO_x$ RRAM," *IEEE Electron. Device Lett.* Jul. 2013;34(8):1005-7.
U.S. Appl. No. 13/780,262, filed Feb. 28, 2013, Mickel et al.
U.S. Appl. No. 13/750,451, filed Jan. 25, 2013, Stevens et al.
Ambrogio S et al., "Understanding switching variability and random telegraph noise in resistive RAM," *IEEE Int'l Electron Dev. Meeting*, held on Dec. 9-11, 2013 in Washington, DC, pp. 31.5.1-31.5.4.
Balatti S et al., "Multiple memory states in resistive switching devices through controlled size and orientation of the conductive filament," *Adv. Mater.* 2013;25:1474-8.
Balatti S et al., Supporting Information for "Multiple memory states in resistive switching devices through controlled size and orientation of the conductive filament," *Adv. Mater.* 2013;25:1474-8 (6 pp.).
Burr GW, "Overview of candidate device technologies for storage-class memory," *IBM J. Res. Develop.* Jul. 2008;52(4.5):449-64.
Chang T et al., "Short-term memory to long-term memory transition in a nanoscale memristor," *ACS Nano* 2011;5(9):7669-76.
Chen JY et al., "Dynamic evolution of conducting nanofilament in resistive switching memories," *Nano Lett.* Jul. 2013;13:3671-7.
Chua LO et al., "Memristive devices and systems," *Proc. IEEE* Feb. 1976;64(2):209-23.
Chua Lo, "Memristor—The missing circuit element," *IEEE Trans. Circuit Theory* Sep. 1971;18(5):507-19.
Dieny B et al., "Emerging non-volatile memories: magnetic and resistive technologies," *J. Phys. D: Appl. Phys.* 2013;46(7):070301 (1 p.).
Gao XM et al "An innovative sensing architecture for multilevel Flash memory," *2012 IEEE 11th Int'l Conf. on Solid-State and Integrated Circuit Technol. (ICSICT)*, held on Oct. 29, 2012-Nov. 1, 2012, in Xi'an, pp. 1-3.
Garcia V et al., "Electronics: Inside story of ferroelectric memories," *Nature* Mar. 2012:483:279-81.
Ielmini D et al., "Evidence for voltage-driven set/reset processes in bipolar switching RRAM," *IEEE Trans. Electron Devices* Aug. 2012;59(8):2049-56.
Ielmini D, "Reliability issues and modeling of Flash and post-Flash memory," *Microelectron. Eng.* Sep.-Jul. 2009;86(7-9):1870-5.
Indiveri G et al., "Integration of nanoscale memristor synapses in neuromorphic computing architectures," *Nanotechnology* 2013;24(38):384010 (13 pp.).
James CD et al., "A comprehensive approach to decipher biological computation to achieve next generation high-performance exascale computing," *Sandia Report SAND2013-7915*, Oct. 2013 (105 pp.).
Jo SH et al., "Nanoscale memristor device as synapse in neuromorphic systems," *Nano Lett.* 2010;10:1297-301.
Kim H et al., "Memristor-based multilevel memory," *2010 12th Int'l Workshop on Cellular Nanoscale Networks and Their Applications (CNNA)*, held on Feb. 3-5, 2010, in Berkeley, CA, pp. 1-6.
Kim KM et al., "The conical shape filament growth model in unipolar resistance switching of $TiO_2$ thin film," *Appl. Phys. Lett.* 2009;94:122109 (3 pp.).
Kwon DH et al., "Atomic structure of conducting nanofilaments in $TiO_2$ resistive switching memory," *Nat. Nanotechnol.* 2010;5(2):148-53.
Larentis S et al. "Filament diffusion model for simulating reset and retention processes in RRAM," *Microelectron. Eng.* Jul. 2011;88(7):1119-23.
Larentis S et al., "Resistive switching by voltage-driven ion migration in bipolar RRAM—Part II: Modeling," *IEEE Trans. Electron Devices* Sep. 2012;59(9):2468-75.
Lee J et al., "Diode-less nano-scale $ZrO_x/HfO_x$ RRAM device with excellent switching uniformity and reliability for high-density cross-point memory applications," *IEEE Int'l Electron Dev. Meeting (IEDM)*, held on Dec. 6-8, 2010 in San Francisco, CA, pp. 19.15.1-19.15.4.
Lee MJ et al., "A fast, high-endurance and scalable non-volatile memory device made from asymmetric $Ta_2O_{5-x}/TaO_{2-x}$ bilayer structures," *Nat. Mater.* Jul. 2011;10:625-30.
Liu Q et al., "Controllable growth of nanoscale conductive filaments in solid-electrolyte-based ReRAM by using a metal nanocrystal covered bottom electrode," *ACS Nano* 2010;4(10):6162-8.
Lohn AJ et al., "A CMOS compatible, forming free $TaO_x$ ReRAM," *ECS Trans.* 2013;58(5):59-65.
Lohn AJ et al., "Analytical estimations for thermal crosstalk, retention, and scaling limits in filamentary resistive memory," *J. Appl. Phys.* 2014;115:234507 (7 pp.).

(56) References Cited

OTHER PUBLICATIONS

Lohn AJ et al., "Degenerate resistive switching and ultrahigh density storage in resistive memory," arXiv:1406.4033 [cond-mat.mtrl-sci], accessible from http://arxiv.org/abs/1406.4033 (15 pp.).

Lohn AJ et al., "Dynamics of percolative breakdown mechanism in tantalum oxide resistive switching," *Appl. Phys. Lett.* 2013;103:173503 (4 pp.).

Lohn AJ et al., "Mechanism of electrical shorting failure mode in resistive switching," *J. Appl. Phys.* 2014;116:034506 (5 pp.).

Lohn AJ et al., "Optimizing $TaO_x$ memristor performance and consistency within the reactive sputtering "forbidden region"," *Appl. Phys. Lett.* 2013;103:063502 (4 pp.).

Lohn AJ et al., "Stages of switching in tantalum oxide memristor," *IEEE Int'l Memory Workshop*, held May 26-29, 2013 in Monterey, CA (4 pp.).

Lu YM et al., "Impact of Joule heating on the microstructure of nanoscale $TiO_2$ resistive switching devices," *J. Appl. Phys.* 2013;113(16):163703 (9 pp.).

Manem H et al., "A read-monitored write circuit for 1T1M multi-level memristor memories," *2011 IEEE Int'l Symp. on Circuits and Systems (ISCAS)*, held on May 15-18, 2011 in Rio de Janeiro, pp. 2938-2941.

Miao F et al., "Anatomy of a nanoscale conduction channel reveals the mechanism of a high-performance memristor," *Adv. Mater.* Dec. 2011;23(47):5633-40.

Miao F et al., "Continuous electrical tuning of the chemical composition of $TaO_x$-based memristors," *ACS Nano* 2012;6(3):2312-8.

Mickel PR et al., "A physical model of switching dynamics in tantalum oxide memristive devices," *Appl. Phys. Lett.* 2013;102:223502 (5 pp.).

Mickel PR et al., "Detection and characterization of multi-filament evolution during resistive switching," *Appl. Phys. Let..* 2014;105:053503 (4 pp.).

Mickel PR et al., "Isothermal switching and detailed filament evolution in memristive systems," *Adv. Mater.* 2014;26:4486-90.

Mickel PR et al., Supporting Information for "Isothermal switching and detailed filament evolution in memristive systems," *Adv. Mater.* 2014;26:4486-90 (8 pp.).

Mickel PR et al., "Memristive switching: Physical mechanisms and applications," *Mod. Phys. Lett. B* Apr. 2014;28(10):1430003 (25 pp.).

Mickel PR et al., "Multilayer memristive/memcapacitive devices with engineered conduction fronts," *Eur. Phys. J. Appl. Phys.* 2013;62:30102 (6 pp.).

Moore GE, "Cramming more components onto integrated circuits," *Proc. of the IEEE* Jan. 1998;86(1):82-5.

Muthuswamy B et al., "Memristor-based chaotic circuits," *IETE Tech. Rev.* Nov.-Dec. 2009; 26(6):417 (16 pp.).

Nardi F et al., "Resistive switching by voltage-driven ion migration in bipolar RRAM—Part I: Experimental study," *IEEE Trans. Electron Dev.* Sep. 2012;59(9):2461-7.

Panagopoulos G et al., "Exploring variability and reliability of multi-level STT-MRAM cells," *2012 70th Annual Dev. Res. Conf. (DRC)*, held on Jun. 18-20, 2012 at University Park, TX, p. 139-140.

Park GS et al., "In situ observation of filamentary conducting channels in an asymmetric $Ta_2O_{5-x}/TaO_{2-x}$ bilayer structure," *Nat. Commun.* Sep. 2013;4:2382 (9 pp.).

Park J et al., "Resistive switching characteristics of ultra-thin $TiO_x$," *Microelectron. Eng.* 2011;88:1136-9.

Pickett MD et al., "A scalable neuristor built with Mott memristors," *Nat. Mater.* 2013;12:114-7.

Pickett MD et al., "Switching dynamics in titanium dioxide memristive devices," *J. Appl. Phys.* 2009;106:074508 (6 pp.).

Puglisi FM et al., "Random telegraph signal noise properties of HfOx RRAM in high resistive state," *Proc. of the Europ. Solid-State Dev. Res. Conf.*, held on Sep. 17-21, 2012 in Bordeaux, France, pp. 274-277.

Stevens JE et al., "Reactive sputtering of substoichiometric $Ta_2O_x$ for resistive memory applications," *J. Vac. Sci. Technol. A* Mar./Apr. 2014;32(2):021501 (6 pp.).

Strachan JP et al., "Measuring the switching dynamics and energy efficiency of tantalum oxide memristors," *Nanotechnology* 2011;22:505402 (5 pp.).

Strukov DB et al., "Exponential ionic drift: fast switching and low volatility of thin-film memristors," *Appl. Phys. A* 2009;94(3):515-9.

Strukov DB et al., "The missing memristor found," *Nature* May 2008;453:80-3.

Strukov DB et al., "Thermophoresis/diffusion as a plausible mechanism for unipolar resistive switching in metal-oxide-metal memristors," *Appl. Phys. A* 2012;107:509-18.

Terai M et al., "Memory-state dependence of random telegraph noise of $Ta_2O_{5/Ti2}$ stack ReRAM," *IEEE Electron Dev. Lett.* Nov. 2010;31(11):1302-4.

Torrezan AC et al., "Sub-nanosecond switching of a tantalum oxide memristor," *Nanotechnology* 2011;22(48):485203 (7 pp.).

Waser R et al., "Nanoionics-based resistive switching memories," *Nat. Mater.* 2007;6(11):833-40.

Waser R et al., "Redox-based resistive switching memories—nanoionic mechanisms, prospects, and challenges," *Adv. Mater.* 2009;21(25-26):2632-63.

Wei Z et al., "Retention model for high-density ReRAM," *4th IEEE Int'l Memory Workshop (IMW)*, held on May 20-23, 2012 in Milan (pp. 1-4).

Yang JJ et al., "Memristive devices for computing," *Nat. Nanotechnol.* 2013;8(1):13-24.

Yang JJ et al., Supplementary Information for "Memristive devices for computing," *Nat. Nanotechnol.* 2013;8(1):13-24 (10 pp.).

Yang JJ et al., "Metal oxide memories based on thermochemical and valence change mechanisms," *MRS Bull.* Feb. 2012;37:131-7.

Yu S et al., "Investigating the switching dynamics and multilevel capability of bipolar metal oxide resistive switching memory," *Appl. Phys. Lett.* 2011;98:103514 (3 pp.).

\* cited by examiner

MULTILEVEL RESISTIVE INFORMATION STORAGE AND RETRIEVAL

CROSS-REFERENCE TO RELATED APPLICATION

This application claims the benefit of U.S. Provisional Application No. 61/866,690, filed Aug. 16, 2013, which is hereby incorporated by reference in its entirety.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention is directed generally to resistive random-access memory (RRAM or ReRAM) systems, as well as methods of employing multiple state variables to form degenerate states in such memory systems.

BACKGROUND OF THE INVENTION

Moore's law, the exponential increase in transistor density, has been the driving force for the technological revolution that has occurred over the past decades. Due to increasing difficulties to continue this pace, new approaches are being sought broadly.

Memristors (also known as ReRAM5) have been proposed among the leading candidates to replace transistors, in part, due to their ability to store information within a range of resistances instead of a simple digital ON or OFF. Even so, a memristor as conventionally used is at best one-dimensional in information space. Great advances in information storage density may be achievable with devices capable of data storage in an information space of two or more dimensions.

SUMMARY OF THE INVENTION

The present invention relates to methods for achieving multilevel information storage in one or more resistive memory devices (or memristors). A memristor is composed of an insulator and is configured to support a conductive filament within this insulator. Typically, a memristor possesses an ON state and an OFF state, and each state is described by one state variable (i.e., a low resistance state corresponding to the ON state and a high resistance state corresponding to the OFF state).

Here, we demonstrate that filament formation within a memristor can be controlled, such that the filament can be characterized by one or more state variables. Exemplary state variables include filament geometry (e.g., filament radius r), filament conductivity $\sigma$, resistance of the device R, and/or applied power P of the device required to change the resistance of the device. Each state can thus be described by two or more of these state variables (as compared to devices capable of storing only one state variable, either ON or OFF). Thus, use of two or more state variables allows for more degenerate states and multiple states, which in turn can be stored in a lower number of devices. Furthermore, we describe methodologies to write and read stored information, and such methodologies can be controlled electrically. Taken together, the present invention allows for immense gains in information storage density and in simplified information retrieval.

Accordingly, the present invention features a method for storing information in a first resistive memory device having a reactive electrode. The method includes, with positive polarity on the reactive electrode, applying an electric power in a first sweep until a first desired stopping point $P_{R1}$ is reached; and then with negative polarity on the reactive electrode, applying an electric power in a second sweep until a first desired set point $P_{C1}$ is reached.

In another embodiment, the method includes, with positive polarity on the reactive electrode, applying electric power to the first device (e.g., so as to decrease the resistance of the first device); in a first sweep, varying the applied power until a first desired stopping point $P_{R1}$ is reached; then with negative polarity on the reactive electrode, applying electric power to the first device; and in a second sweep, varying the applied power until a first desired set point $P_{C1}$ is reached.

In some embodiments, the method provides a first filament within the first device. In further embodiments, the first filament is characterized by a state having a plurality of state variables. In yet other embodiments, at least one state variable is established by $P_{R1}$ and/or $P_{C1}$.

In some embodiments, $P_{R1}$ establishes a first filament radius $r_1$ as one state variable and $P_{C1}$ established a first conductivity $\sigma_1$ as a second state variable.

In other embodiments, a combination of state variables $<r_1, \sigma_1>$ corresponds to a $(R_1, P_1)$ storage coordinate, where $R_1$ denotes a resistance of the first device and $P_1$ denotes an applied power needed to begin changing the resistance of the first device.

In some embodiments, $P_{R1}$ of the first sweep determines which (R,P) storage coordinates will be accessible in the second sweep.

In yet other embodiments, each of $P_{R1}$ and $P_{C1}$, together, establishes a first power-resistance angle $\theta_1$ as a third state variable, where $\theta_1$ denotes a slope of $\delta P/\delta R$.

In further embodiments, the method includes reading the state of the first filament. In some embodiments, the reading step includes: performing a sweep of applied power $P_{app}$ to the first device and monitoring a resistance of the device during the sweep, where a change in resistance is indicated as the resistance setpoint $R_{sp}$. In other embodiments, $P_{app}$ corresponds to $P_1$ and $R_{sp}$ corresponds to $R_1$.

In further embodiments, the method includes storing information in a second resistive memory device having a reactive electrode. In some embodiments, the storing step includes, with positive polarity on the reactive electrode, applying electric power to the second device in a third sweep until a second desired stopping point $P_{R2}$ is reached; and then with negative polarity on the reactive electrode, applying electric power to the second device in a fourth sweep until a second desired set point $P_{C2}$ is reached. In other embodiments, the step provides a second filament within the second device, where the second filament is characterized by a state having a plurality of state variables, and where at least one state variable is established by $P_{R2}$ and/or $P_{C2}$.

In other embodiments, the storing step in includes with positive polarity on the reactive electrode, applying electric power to the second device so as to decrease the resistance of the second device; in a third sweep, varying the applied power until a second desired stopping point $P_{R2}$ is reached; then with negative polarity on the reactive electrode, applying electric power to the second device; and in a fourth sweep, varying the applied power until a second desired set point $P_{C2}$ is reached.

In some embodiments, $P_{R2}$ establishes a second filament radius $r_2$ as one state variable, $P_{C1}$ establishes a second conductivity $\sigma_2$ as a second state variable, and/or the combination of $P_{R2}$ and $P_{C1}$ establishes a second power-resistance angle $\theta_2$ as the third state variable.

In other embodiments, a combination of state variables $<r_2, \sigma_2, \theta_2>$ corresponds to a $(R_2, P_2, \delta P_2/\delta R_2)$ storage coordinate, where $R_2$ denotes a resistance of the second device, $P_2$ denotes an applied power needed to begin changing the resistance of the second device, and $\delta P_2/\delta R_2$ denotes a slope of a change in applied power over a change in resistance.

In any embodiment herein, $R_1 \neq R_2$ and/or $P_1 \neq P_2$. In other embodiments, $R_1 = R_2$ or $P_1 = P_2$.

In another aspect, the invention features a resistive memory device made or formed by any useful method (e.g., any described herein).

In yet another aspect, the invention features a memory including a plurality of m resistive memory devices. In some embodiments, each said device contains a respective stored data value embodied in a set of two or more state variables, where the state variables include a combination of state variables $<r_n, \sigma_n>$ for each $n^{th}$ filament in each $m^{th}$ device, $r_n$ denotes a filament radius for the $n^{th}$ filament, and $\sigma_n$ denotes a conductivity for the $n^{th}$ filament. In other embodiments, each $<r_n, \sigma_n>$ corresponds to a $(R_n, P_n)$ storage coordinate, where $R_n$ denotes a resistance of the $m^{th}$ device having the $n^{th}$ filament, and $P_n$ denotes an applied power needed to begin changing the resistance of the $n^{th}$ device. In yet other embodiments, the state variables include a combination of $<r_n, \sigma_n, \theta_n>$ for each $n^{th}$ filament in each $m^{th}$ device and $\theta_n$ denotes a power-resistance angle for the $n^{th}$ filament, where each $<r_n, \sigma_n, \theta_n>$ corresponds to a $(R_n, P_n, \delta P_n/\delta R_n)$ storage coordinate and $\delta P_n/\delta R_n$ denotes a slope of a change in applied power over a change in resistance for the $n^{th}$ filament.

In yet another aspect, the invention feature a system, including: at least one resistive memory device having a reactive electrode; a monitoring device configured to measure and to indicate the electrical resistance of the device; and a controllable power source configured, in response to the inputting of data for storage, to perform any method described herein.

In one aspect, the invention features a method for storing, writing, and/or reading information in a resistive memory device having a reactive electrode. The method can include, with positive polarity on the reactive electrode, applying an electric power in a first sweep until a first desired stopping point $P_{Rn}$ is reached; and then with negative polarity on the reactive electrode, applying an electric power in a second sweep until a first desired set point $P_{Cn}$ is reached, thereby providing an $n^{th}$ filament in the device. For each device, the first and second sweeps can be conducted any number of useful times to write information on the first device. In one embodiment, the method can be performed for each $n^{th}$ filament, which is written and rewritten for an n number of times in the same device with the same or different $P_{Rn}$ and $P_{Cn}$. In another embodiment, the method can be performed for each $n^{th}$ filament that is written and rewritten in a plurality of m devices, where each $P_{Rn}$ and $P_{Cn}$ can be the same or different. As used herein, m is an integer of more than 1.

In another aspect, invention features a method of storing, writing, and/or reading information in an array having a plurality of resistive memory devices (e.g., where each device has a reactive electrode). The method can include, with positive polarity on the reactive electrode, applying an electric power to at least one device in a first sweep until a first desired stopping point $P_{Rn}$ is reached; and then with negative polarity on the reactive electrode, applying an electric power to the at least one device in a second sweep until a first desired set point $P_{Cn}$ is reached. For each device, the first and second sweeps can be conducted any number of useful times to write information on the first device. In addition, each device within the array can be written, read, rewritten, and reread any useful number of times. In addition, each stopping point $P_{Rn}$ and set point $P_{Cn}$ for each filament in each device can be the same or different. In some embodiments, each storage coordinate $(R_n, P_n)$ for each filament in each device can be the same or different.

In any embodiment herein, the sweep establishing $P_{Rn}$ (e.g., the first sweep for $P_{R1}$) is current limited. In another embodiment, the sweep establishing $P_{Cn}$ (e.g., the second sweep for $P_{C1}$) is voltage limited. In yet another embodiment, one or more sweeps (e.g., the first, second, and/or other sweeps) are power-controlled.

In any embodiment herein, $P_{Rn}$ establishes a filament radius $r_n$ as one state variable and $P_{Cn}$ establishes a conductivity $\sigma_n$ as a second state variable for the $n^{th}$ filament. In other embodiments, the conductivity $\sigma_n$ is a radial conductivity $\sigma_{r,n}$ for an $n^{th}$ filament at a radial position $\rho$ (e.g., where $\rho$ is any value between 0 (i.e., at the center of the filament) and $r_n$ (i.e., at the edge of the filament)). In yet other embodiments, each of $P_{Rn}$ and $P_{Cn}$, together, establishes a power-resistance angle $\theta_n$ as a third state variable, where $\theta_n$ denotes a slope of $\delta P/\delta R$.

In any embodiment herein, a combination of state variables $<r_n, \sigma_n>$ or $<r_n, \sigma_n, \theta_n>$ corresponds to a $(R_n, P_n)$ storage coordinate, where $R_n$ denotes a resistance of a device having the $n^{th}$ filament, and $P_n$ denotes an applied power needed to begin changing the resistance of the device having the $n^{th}$ filament. In other embodiments, a combination of state variables $<r_n, \sigma_n>$ or $<r_n, \sigma_n, \theta_n>$ corresponds to a set of distinct $(R,P)$ coordinates (i.e., a set of $(r_{n-i}, p_{n-i})$) for each data curve; a slope $\delta P_n/\delta R_n$; and/or a fit $f_n(R,P)$.

In any embodiment herein, the method includes reading the state of the $n^{th}$ filament. In some embodiments, the reading step includes performing a sweep of applied power $P_{app}$ to the first device and monitoring a resistance of the device during the sweep, where a change in resistance is indicated as the resistance setpoint $R_{sp}$. In any embodiment herein, $P_{app}$ corresponds to $P_n$, and $R_{sp}$ corresponds to $R_n$.

DEFINITIONS

As used herein, the term "about" means +/−10% of any recited value. As used herein, this term modifies any recited value, range of values, or endpoints of one or more ranges.

As used herein, the terms "top," "bottom," "upper," "lower," "above," and "below" are used to provide a relative relationship between structures. The use of these terms does not indicate or require that a particular structure must be located at a particular location in the apparatus.

Other features and advantages of the invention will be apparent from the following description and the claims.

DETAILED DESCRIPTION OF THE INVENTION

By employing the methods herein, information can be written in a controlled manner. The present invention employs a memristor device to write and store information. Each storage coordinate (e.g., a $(R_n, P_n, \delta P_n/\delta R_n)$ coordinate) reflects two or more physical characteristics of a conductive filament within a memristor device. Generally, conductive filaments are difficult to form in a controlled manner. Here, we present methods to form and characterize conductive filaments in a precise way. Each component of the multiple variable storage coordinate (e.g., R and P) is influenced by one or more physical characteristics of the conductive filament (e.g., physical characteristics, such as filament radius r or filament conductivity $\sigma$). Using the methods herein, filament radius r and filament conductivity $\sigma$ can be independently set or written by applying power to the reactive electrode of the memristor device. Thus, information can be written simply.

In addition, we found that the conventional approach to multistate memory drastically understates the information storage capacity of ReRAM devices. Typically, information is stored in zero-dimension or in one-dimension. The present invention relates to information storage in multiple dimensions (i.e., two or more dimensions), and each bit of information can be represented by a multiple variable storage coordinate, e.g., a $(R_n, P_n)$ coordinate or a $(R_n, P_n, \delta P_n/\delta R_n)$ coordinate. These storage coordinates reflect resistance $R_n$ and applied power $P_n$, and these resistance and power values can be measured electrically. Thus, information can be read simply.

As these coordinates have multiple dimensions, degenerate states can be present and, yet, still be resolved. For instance, each resistance value $R_x$ can store any y number of states, so long as each power value $P_y$ is different. Thus, information can be stored at high density.

Details on methods of writing, reading, and storing information with memristors are described herein. Using standard tantalum oxide memristor devices and a simple approach to read and write, we have demonstrated multi-state storage in multidimensional information space, and we suggest approaches to expand into even more hidden dimensions. Based on the details herein, this approach can be applied to a wide range of memristor devices formed from various materials.

Multidimensional Information Space

A range of dimensionalities in information is possible but difficult to realize. For instance, generally, information space in digital systems is zero-dimensional (FIG. 1(a)), where a single state can exist or not exist. Resistive memory, like several other device structures, can be thought of as one-dimensional in information space (FIG. 1(b)), where information can be stored as a point along any of a range of possible resistance states.

Figure 1:
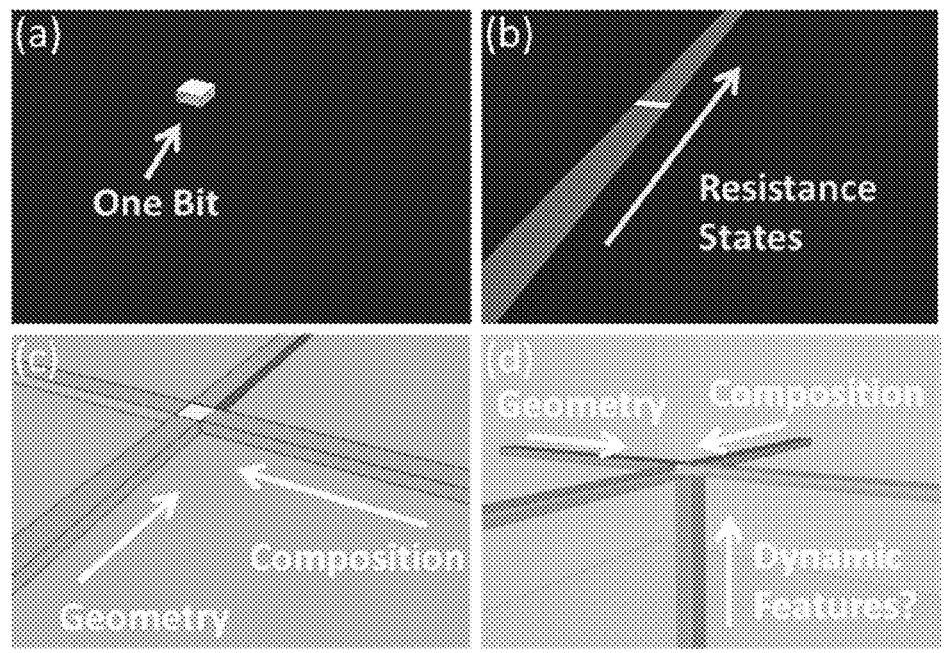
FIG. 1 shows a schematic of the dimensionality of information spaces, where specific states (shown in white) can exist anywhere within the gray bounds. Shown are (a) digital memory and (b) traditional multi-level cell approaches. Resistive memory systems are shown having (c) two-dimensional storage (e.g., having two state variables, such as geometry and composition) or (d) expansion into more dimensions (e.g., having three or more state variables).
Figure 2A:
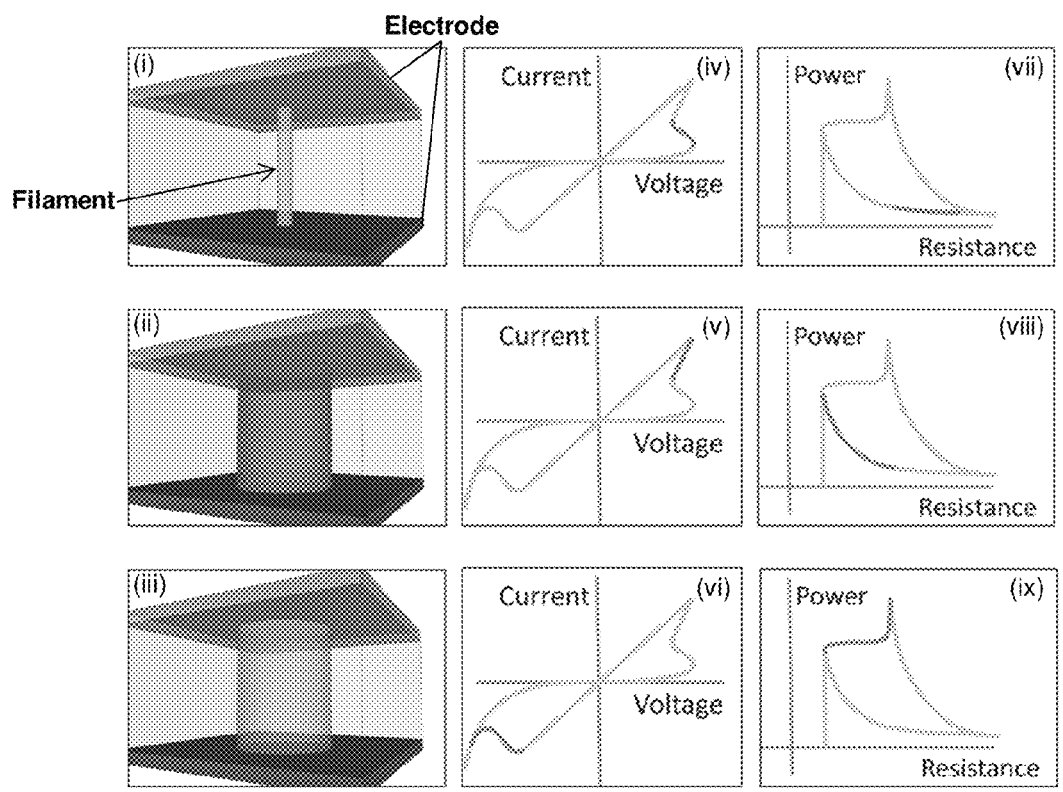
FIG. 2A-2C shows that the radius r and conductivity $\sigma$ of a conductive filament can be tuned separately by progressing through the hysteresis loop. (A) Schematics are provided for the conductive filament (i-iii), which can be equivalently represented in either (iv-vi) current-voltage (I-V) coordinates or (vii-ix) power-resistance (P-R) coordinates. (B, C) Provided are schematics showing the relationship between state variables $<r_n, \sigma_n>$ for each $n^{th}$ configuration and its corresponding measurable $(R_n, P_n)$ storage coordinate.

Here, we describe information storage in multiple dimensions, i.e., in two or more dimensions. As shown in FIG. 1(c), the present invention includes information storage in two dimensions, such as geometry or composition. As an example, two-dimensional storage is realized by controlling the geometry and composition of a filament in a memristor device. FIG. 2A(i)-(iii) shows schematics of an exemplary memristor having a filament disposed within an insulator and between two electrodes. Geometry (e.g., radius r) and composition (e.g., conductivity σ) can be tuned and controlled separately by progressing through the current-voltage hysteresis loop (FIG. 2A(iv)-(vi)). This step of tuning or controlling filament formation is the writing or SET step and is further discussed below.

In fact, memristors may even be capable of more, possibly many more dimensions (FIG. 1(d)). For instance, an additional dimension includes a power-resistance angle θ, which is the angle between a baseline and a δP/δR slope, which is a change in applied power P over a change in resistance R for a filament. Details on how to set θ are also described herein.

Thus, multilevel space can be realized by employing two or more state variables. Exemplary state variables include filament geometry, e.g., a filament radius $r_n$ for an $n^{th}$ filament or a filament shape, such as a cylinder or a set of concentric nested cylinders; filament composition, e.g., a filament conductivity $\sigma_n$ for an $n^{th}$ filament or a radial conductivity $\sigma_{r,n}$ for an $n^{th}$ filament at a radial position ρ (e.g., where ρ is any value between 0 (i.e., at the center of the filament) and $r_n$ (i.e., at the edge of the filament)); and dynamic feature, e.g., power-resistance angle $\theta_n$ for an $n^{th}$ filament.

Reading multiple state variables is simplified by using the equations herein to determine the applied power required to activate resistive switching (e.g., P in Eq. 1), the voltage to read information (e.g., $V_{READ}$ in Eq. 2 or 14), and the predicted switching data (e.g., constitutive Eqs. 7a-7b). Although it is physically intuitive to span information space using state variables such as filament radius, it is more practical to consider the electrical power and resistance. Thus, multilevel space can be characterized by storage coordinates including a combination of a resistance $R_n$ of the $n^{th}$ device, an applied power $P_n$ needed to begin changing the resistance of the $n^{th}$ device, and a slope $\delta P_n/\delta R_n$ of a change in applied power over a change in resistance for the $n^{th}$ filament. Resistance can be easily read electrically, and since the thermal profile depends on both geometry and conductivity, the power required to reach thermal activation can be used to read the second dimension in information space.

Methods of Writing Information

The present invention includes methods of writing information by employing a memristor device. In particular, information is written by forming filaments having particular state variables, such as $r_n$, $\sigma_n$, and/or $\theta_n$. Filament formation can be controlled by navigating the hysteresis curves obtained when switching a memristor between ON and OFF states.

In FIG. 2A, filament formation is shown schematically ((i)-(iii)), as well as in corresponding current-voltage (I-V) curves ((iv)-(vi)) and power-resistance (P-R) curves ((vii)-(ix)). Redrawing the I-V hysteresis loop in terms of P-R coordinates provides a more convenient basis than radius and conductivity. Starting from the high resistance state, positive polarity on the reactive top electrode causes a filament to increase conductivity (i, iv, vii) until saturation. Further increasing power with positive polarity causes the radius to increase (ii, v, viii), and reversing polarity causes conductivity to decrease (iii, vi, ix). In this way, various geometry-conductivity combinations can be achieved.

Figure 2B:
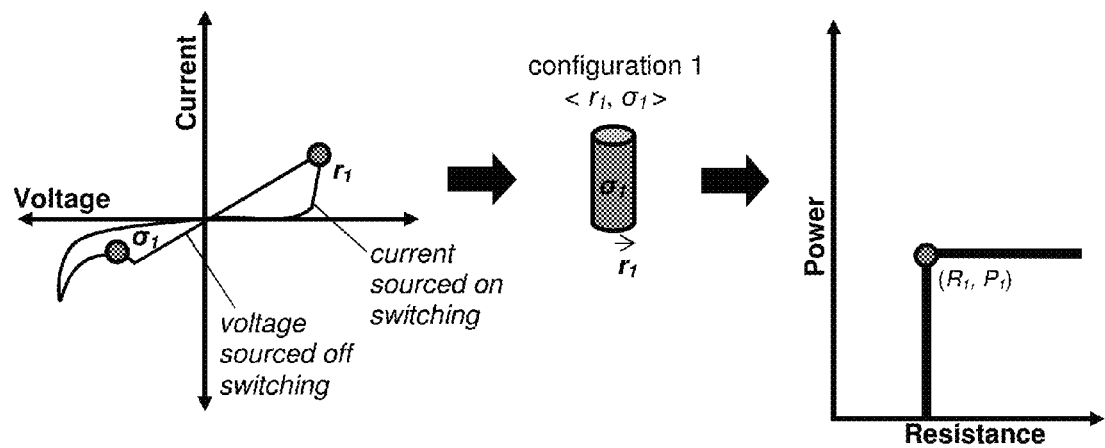

In a simple two-dimensional information space, radius and conductivity are the two separate state variables. By varying the positive power and negative power sequentially, various $r_n$ and $\sigma_n$ combinations can be set (FIG. 2B). For the first configuration $<r_1, \sigma_1>$, applying power with a positive polarity on the reactive electrode sets the filament radius $r_1$. In one embodiment, this power is applied by using current-sourced on switching. For instance, increasing positive current (inert electrode grounded) is applied, thereby decreasing resistance and injecting oxygen vacancies from the reactive electrode until the concentration saturates. After saturation, further increases in positive current results in increasing the radius of the saturated region. When current is applied to a first desired stopping point $P_{R1}$, the filament radius $r_1$ is set (FIG. 2B).

To set conductivity $\sigma_1$, power with an opposite polarity is applied on the reactive electrode. In one embodiment, this power is applied by using voltage-sourced off switching. For instance, increasing negative voltage is applied, thereby increasing resistance and drawing oxygen vacancies back into the reactive electrode. Further increases in negative current result in decreasing conductivity. When voltage is applied to a first desired stopping point $P_{C1}$, the filament conductivity $\sigma_1$ is set (FIG. 2B).

Generally, sweeping power in the positive and negative directions alternately allows one to set the resistance and the electrical power required for thermal activation separately. Additionally, operating in power and resistance gives specific set points that can be reproduced even if the filament properties change with cycling. In that way, the storage locations are unaffected by issues such as device degradation that may affect geometry and conductivity. Degradation effects may limit the range of states but do not affect their location in information space. In some embodiments, current-sourced ON switching was used to set the filament radius ($P=I^2R$, with R decreasing), whereas voltage-sourced OFF switching was used to control the filament conductivity ($P=V^2/R$, with R increasing). In some non-limiting instances, power-limited sourcing can be used for precision control, as negative feedback decreases the applied power and self-limits thermal activation, guaranteeing precise 'freezing' of resistive switching at the desired state-variable values.

In particular, we found that the dominating physics in these devices is thermal activation, which enables steady-state analog operation when using power-limited switching to control filament formation (i.e., current control for resistance reduction and voltage control for resistance increases). The steady-state method of operation simplifies selection of specific resistances and allows the same resistance value to be set to different radius-conductivity combinations precisely.

Filaments with degenerate states can be formed. For instance, by sweeping to a small positive current and small negative voltage, a filament with a small radius and large average conductivity may be formed (configuration 1 having state variables $<r_1, \sigma_1>$, FIG. 2B). Alternatively, by sweeping to a large positive current and a large negative voltage, a filament with a large radius and small conductivity may be formed (configuration 2 having state variables $<r_2, \sigma_2>$, where $r_2>r_1$ and $\sigma_2<\sigma_1$, FIG. 2C). These filament configurations can have equivalent resistances ($R_1=R_2$ in FIG. 2C, right). However, they have substantially different thermal (and therefore switching) properties. The resistive switching curve, and its dependence on each state variable, is described by the following equation:

$$P = \frac{\Delta T / R}{\frac{d_E \sigma}{2k_E d_O} - \frac{r_F^2}{8L_{WF}T_{Crit}d_O^2}},$$ (Eq. 1)

where P is the applied power required to activate resistive switching, $\Delta T$ is the difference between the ambient temperature and the critical thermally-activating temperature $T_{Crit}$, R is the electronic resistance, $\sigma$ is electrical conductivity, $d_E$ is electrode thickness, $k_E$ is electrode thermal conductivity, $d_O$ is the thickness of the oxide insulator, $r_F$ is filament radius, and $L_{WF}$ is the Weidemann-Franz constant. Importantly, comparing to a single hysteresis curve can determine the unknown physical quantities at all switching points including, both state variables ($\sigma_n$ and $r_n$ for each $n^{th}$ filament) and the critical activating temperature ($T_{Crit}$).

Figure 2C:
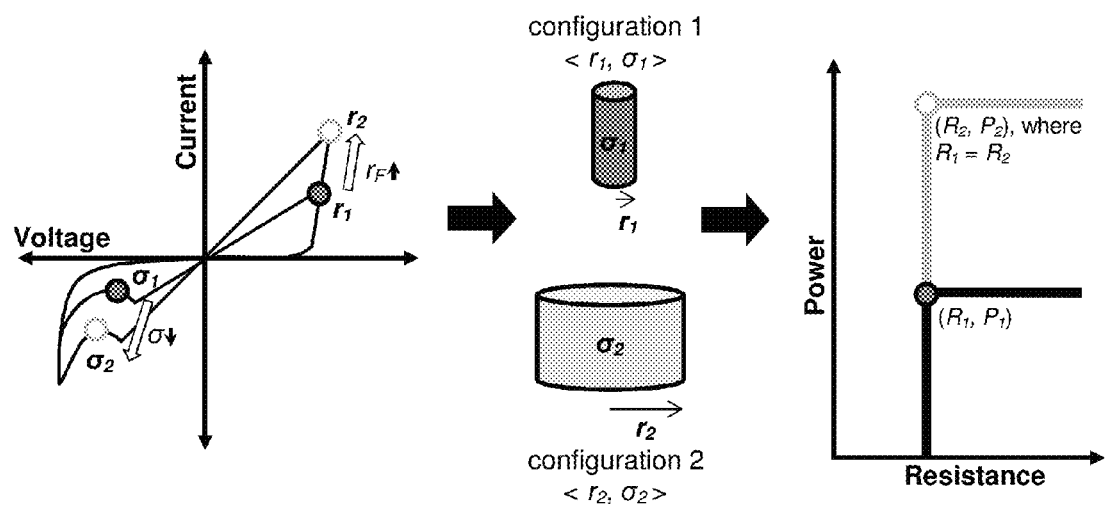

As shown schematically in FIG. 2C (right), alternate combinations of state variables (<r, $\sigma$>) affect the switching properties of the device and give rise to different storage coordinates ($R_n$, $P_n$). As seen, the required resistance R, as well as applied power P required to thermally activate ionic motion and initiate resistive switching is clearly identified. The small-radius/large-conductivity filament configuration <$r_1$, $\sigma_1$> is observed to require substantially less applied power ($P_1$<$P_2$) to thermally activate than the large-radius/small-conductivity filament configuration <$r_2$, $\sigma_2$>. This result is predicted by Eq. 1, where increases in conductivity and decreases in radius cause the required power for thermal activation to diverge. These general features are the result of simplistic hysteresis paths, where starting from a strong OFF state (where the conductivity is low throughout the entire active region of the device) a filament radius is set during ON switching and the filament conductivity is determined by the OFF switching stopping point.

We have shown that since conductivity and radius of the conducting filament in a memristive device can be separately controlled and measured, memristors should be viewed as multi-dimensional in information space. We demonstrated a simple approach to writing and reading these variables with precision and reproducibility by spanning the space in resistance and thermal activation power instead of radius and conductivity. Spanning the space in this way increases the ease of interacting with the device and provides a reproducible method for storing and retrieving data even if the physical properties of the device change over time.

In view of the foregoing, it will be understood that we have found a way to store and retrieve information embodied in multiple state variables in a single resistive memory device. As interpreted in our physical model, multiple state variables are accessible because the filamentary radii and the conductivity of the filamentary structure can be set independently. In an exemplary procedure, according to our present understanding, power applied with the reactive electrode at positive polarity is used to increase the filamentary radius (or more broadly, the filamentary "geometry," as the filament should not generally be understood to be a uniform cylinder) to a desired value. Then power applied with the opposite polarity is used to decrease the conductivity until a desired final resistance state is reached.

The combination of filamentary geometry and conductivity combine to give a particular resistance state that is distinguishable from other such states, even from other states exhibiting the same resistance, by first reading the resistance with appropriate monitoring equipment, and then sweeping the power to the point where the resistance begins to change. The second step, equivalently stated, is to measure the activation power.

In an exemplary procedure for data storage, the step that decreases the resistance is performed under current control (i.e., in a current-limited process), and the step that increases the resistance is performed under voltage control. This limitation is advantageous because it inherently prevents positive feedback which could otherwise result in the applied power exceeding the activation power. Alternatively, both steps may be performed under explicit power control.

Figure 6A:
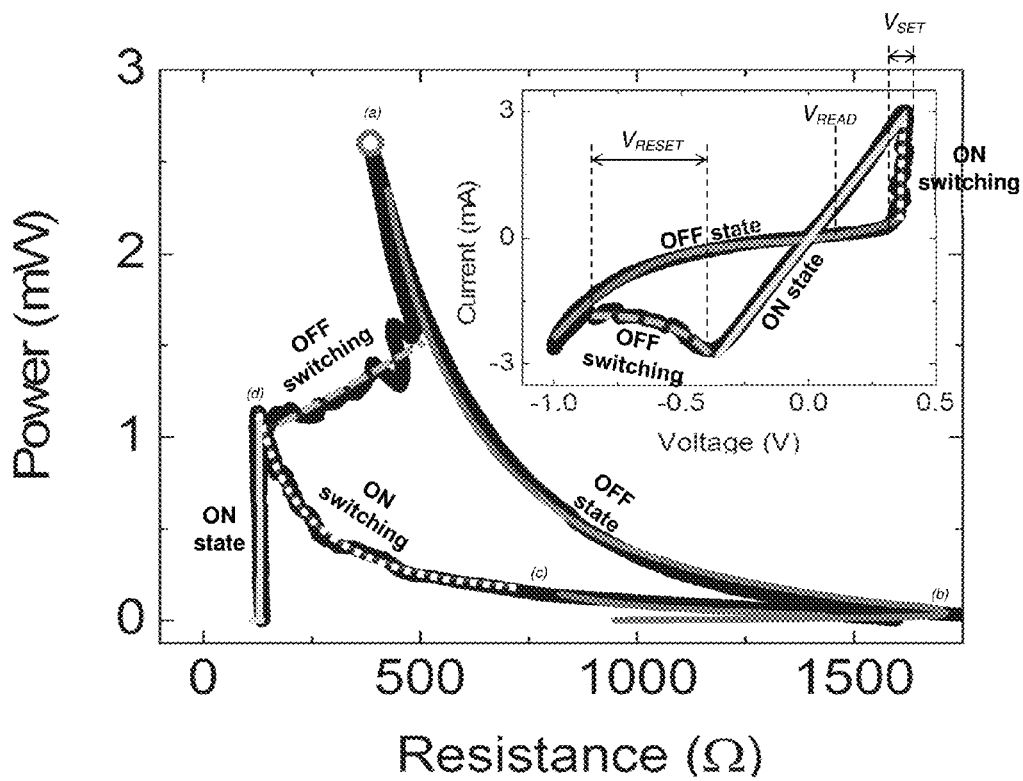
FIG. 6A-6C shows memristor switching. (A) Experimental data (black lines) and theoretically calculated fits (gray or white lines) for hysteresis loops are provided in two coordinate systems: the typical current-voltage basis and the power-resistance basis (inset) natural to the constitutive equations derived here. The loops are divided into four portions: ON switching (white dashed line), ON state (light gray solid line), OFF switching (gray dashed line), and OFF state (dark gray solid lines). (B, C) Also provided are schematics of exemplary memristors.

An exemplary information storage procedure (i.e., a "write" procedure) includes the following steps. First, switch the resistive device to the OFF state, e.g., to point (a), as shown in FIG. 6A. Second, sweep the applied power along the OFF state curve, e.g., along the gray solid line from point (b) to point (c), such as from about 2.5 mW to about 0 mW in FIG. 6A. This process is reversible and does not produce a permanent change. Third, continue to sweep a short distance along the ON switching curve, e.g., along the dashed white line from point (c) to point (d), such as from 0.2 mW to about 1 mW in FIG. 6A. Optionally, this step is performed under current-limited conditions. This step, according to our physical model, will fill the conductive filament to its minimum radius. Fourth, continue to sweep along the P-R curve, such as toward point (d). This will produce a drop in resistance while increasing power, and according to our current understanding will increase the filamentary radius. Stop the sweep at a desired stopping point $P_{R1}$ on the state diagram, which we believe corresponds to a desired value of the filamentary radius $r_n$. This will determine which resistance-power (R,P) combinations will subsequently be accessible for data storage. Very roughly, this step may be thought of as setting the activation power $P_n$. Finally, switch to voltage-limited operation, reverse the applied polarity, and sweep through increasingly negative voltages to pass through the various (R,P) storage coordinates that are accessible. Stop at a first desired set point $P_{C1}$ on the state diagram corresponding to the desired ($R_n$, $P_n$) storage coordinate.

As noted above, filaments in our physical model are not generally to be regarded as uniform cylinders. In fact, we believe that the detailed filamentary geometry and concentration profile provide access to further dimensions, useful for data storage, beyond the two state variables described in detail above. For example, according to our physical model, if the filament assumes a cylindrical shape that is uniform in concentration, the temperature profile across the filament will tend spontaneously toward a distribution that is centrally peaked. On the other hand, if the concentration profile assumes a shape with a depressed center, the temperature profile may tend toward uniformity. The temperature distribution within the filament affects the specific locations where further oxygen vacancies are accreted or depleted. Thus, by manipulating the temperature profile, it is possible to manipulate the distribution of oxygen vacancy doping in the filament. We believe this can be achieved by cycling or alternating applied power between positive and negative polarity. In that manner, one may design a specific concentration profile within the filament.

This profile will result in a distinct trajectory through the R-P state space during the read process, which is readily recognized by monitoring resistance and subsequent activation powers in a sweep that is continued beyond the initial power-induced resistance change.

Methods of Reading Information

The present invention also encompasses methods of reading information written and stored as state variables. As discussed above with respect to FIG. 2C, state variables give rise to measurable storage coordinates, e.g., a storage coordinate ($R_n$, $P_a$). Values for $R_n$ and $P_n$ can be determined by any equations herein, e.g., Eqs. 1, 7a-7b, 9, 15a-15b, and/or 16. As described herein, in some embodiments, each storage coordinate $R_n$ and $P_n$ corresponds to a unique combination of state variables, e.g., $r_n$, $\sigma_n$, or any described herein.

Figure 3A:
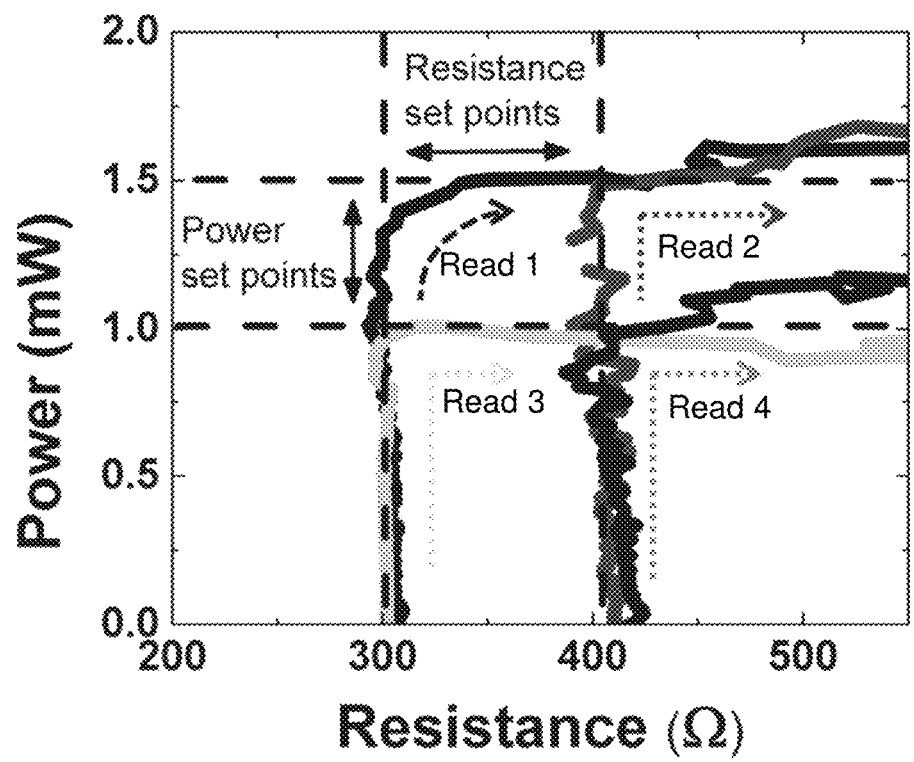
FIG. 3A-3B shows that information can be stored in both activation power and resistance and be read by measuring resistance and observing the power required to change the resistance state. (A) The SET points are indicated by the intersections of the dotted lines, and the READ points are the location of the kink in the solid curves (i.e., where sufficient power is delivered to activate resistance change). (B) Information can be binned and represented by "0" and "1" Boolean states, where each $(R_n, P_n)$ storage coordinate can be represented by a two-dimensional combination of Boolean states.

FIG. 3A shows experimental data showing degenerate storage coordinates. Information is read by performing a sweep of applied power to the memristor device and monitoring a resistance of the device during the sweep. In particular, when a change in resistance (indicated as the resistance setpoint $R_{sp}$) is observed, the power $P_{app}$ providing that $R_{sp}$ gives the storage coordinate $P_n$ and $R_{sp}$ is $R_n$. The intersections of the dotted lines in FIG. 3A show four storage coordinate ($R_n$, $P_n$) at the end of the SET process, and the dashed lines show four READ processes.

Figure 3B:
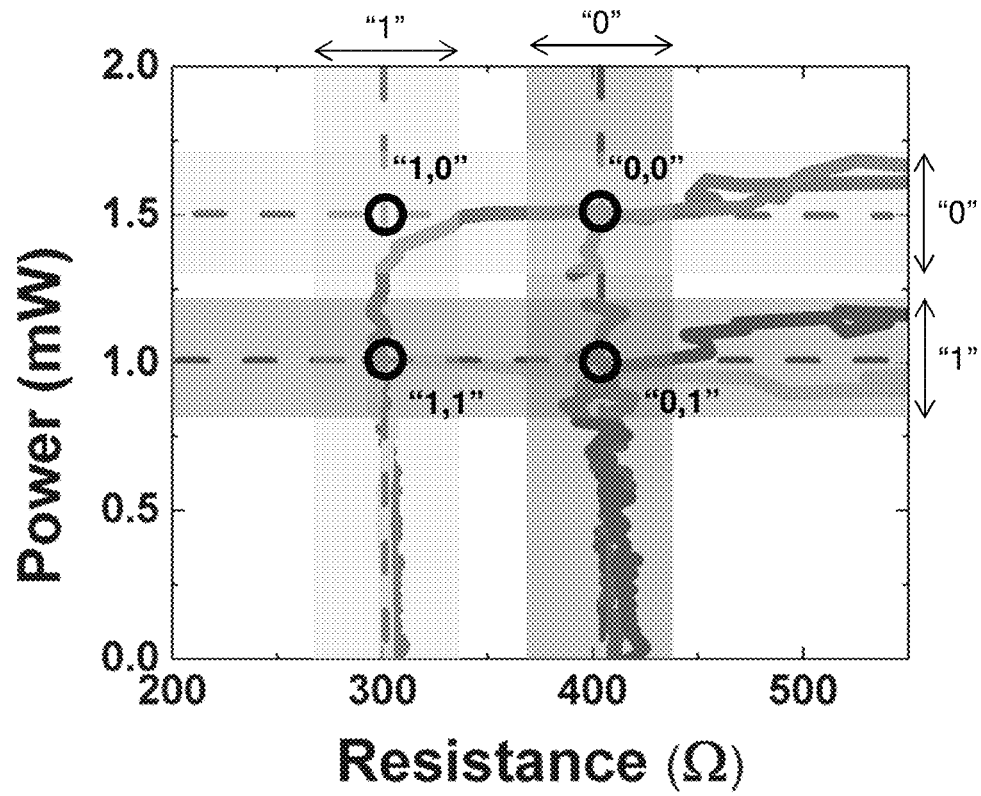

FIG. 3B shows an exemplary method for representing storage coordinates as bits of information. As can be seen, each bit is represented by a storage coordinate ($R_n$, $P_n$), where $R_n$ is either about 300Ω or about 400Ω and $P_n$ is either about 1 mW or about 1.5 mW. Each $R_n$ or $P_n$ can then be binned to be represented by "1" (ON) or "0" (OFF). Thus, each storage coordinate can be used to store multidimensional information (e.g., "1,0," "1,1," "0,1" or "0,0"), thereby allowing for multilevel storage in high density.

Multilevel Storage and Methods Thereof

The present invention relates to methods and memristors, including arrays thereof, configured for high density, multilevel storage. For instance, information can be stored in multiple dimensions (e.g., multiple state variables), thereby expanding the number of storage coordinates capable of being stored in a single device. Assuming that each device can store z states, one can employ an x×y array of devices (e.g., an array of memristor devices) to allow x×y×z states to be stored in the array at one time, where each of x, y, and z is, independently, an integer of 1 or more. In some embodiments, z is an integer of 2 or more.

Figure 4A:
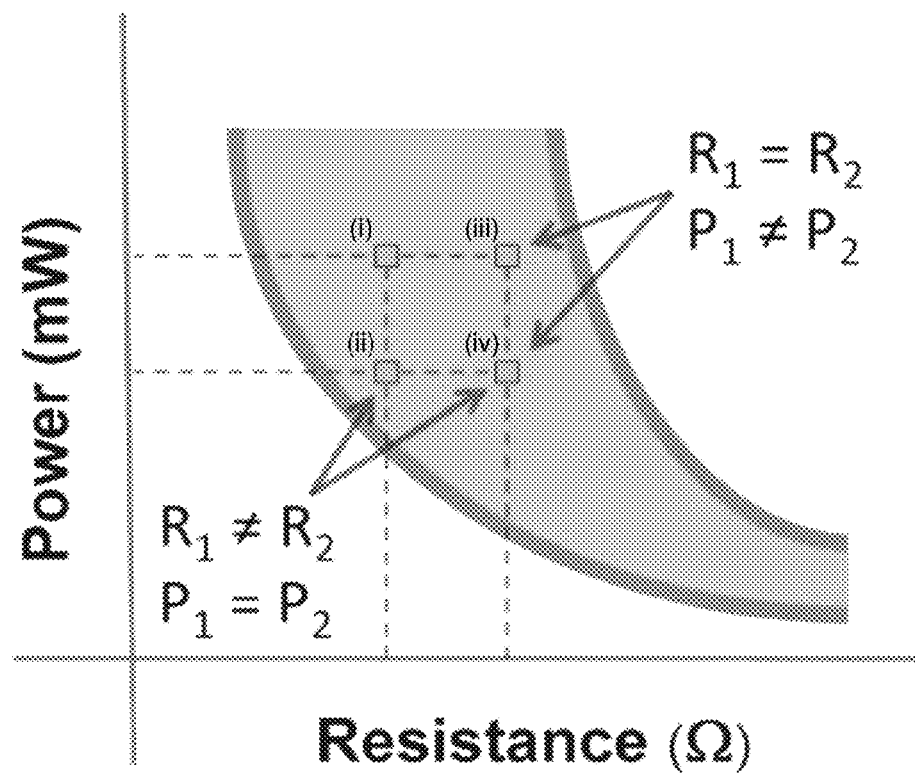
FIG. 4A-4B provides (A) a schematic depiction of storage in two-dimensional information space and (B) data for an experimental demonstration.
Figure 4B:
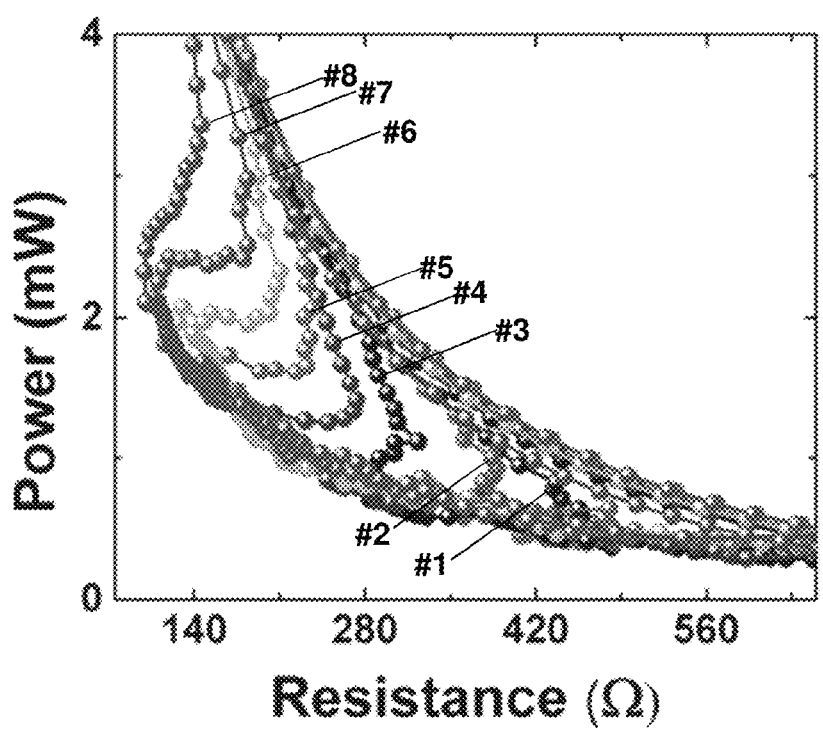

As an example, FIG. 4A-4B describes information storage employing storage coordinates P and R. Information can be stored within any point in the gray bounds in FIG. 4A, illustrating the range of available states that can be achieved. As can be seen, some states can be degenerate. For instance, states (i) to (iv) are degenerate because two states possess the same storage coordinate. For example, states (i) and (iii) possess the same power P, and states (i) and (ii) possess the same resistance R. However, as each storage coordinate is comprised of two state variables, such degeneracy expands the number of allowable states but still allows each state to be uniquely addressed.

To experimentally demonstrate storage in two-dimensional information space, we used tantalum oxide memristors fabricated using a completely CMOS compatible process. Power was applied in long duration pulses, and the devices were then allowed to cool between pulses. Thus, each data point should be viewed as an independent read and write cycle. For the purpose of visual clarity, in this simple proof of principle experiment we only include approximately 100 states. It is apparent from FIG. 4B that much larger state densities are possible. Even at this low state density per dimension, this single memristor displaces approximately seven (7) digital bits. With sensitive electronics operating in steady state, it should be possible to extend the number of states per dimension greatly to achieve state densities well beyond what we show here.

The above discussion assumes cylindrical filaments with constant conductivity which is an approximation that agrees well with experiment but is not true in all cases. There will certainly be gradients in conductivity. When applying negative power to reduce conductivity of the filament, the thermally activated region will begin near the center and proceed outward. The resulting conductivity distribution will be shaped like an annulus or depressed plateau.

Figure 5A:
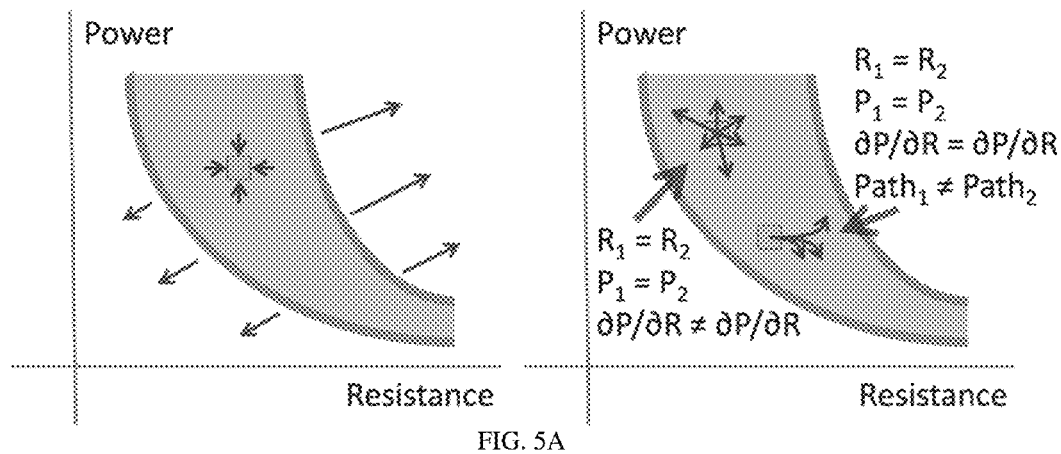
FIG. 5A-5C provides (A) schematics to increase storage density (left) by increasing the range of states or state sensitivity or (right) by adding additional dimensions to the information space, such as rates of change during read or the path taken through power and resistance space. (B) Data are also provided, where power-resistance switching curves are shown for multiple radial conductivity profiles (labeled "1", "2", and "3"). A finite difference thermal switching simulator was shown to reproduce the observed P-R switching characteristics (upper inset), as a result of the radial concentration profiles shown in the lower inset. (C) Additional dimensions are provided in the R-P coordinate system.

Further methodologies can be used to provide high density storage. In one instance, storage density is increased by increasing the range of states or state sensitivity (FIG. 5A, left). For example, the range of states (depicted as arrows leading away from the bounded gray area) can be increased by increasing the range of the storage coordinates P and R. For instance, additional P and R values can be accessed by increasing or decreasing the power limit of the electric power applied to the device. By way of example only, lowering the current limit when establishing the filament radius $r_n$ would provide a larger radius, thereby increasing the P value. In yet another example, state sensitivity (depicted as arrows leading toward the center of the dark gray square representing a state) can be increased by decreasing noise for the P and R values.

In another instance, storage density is increased by adding additional dimensions to the information space, such as rates of change during a read process (e.g., $\delta P_n/\delta R_n$) or the path taken through the P-R space (FIG. 5A, right). For example, paths can be characterized by the number of deflection points between straight lines, slopes of lines, a curve fit model such as a non-linear regression curve model, or a combination of tangent lines. FIG. 5C provides exemplary simulated R-P curves representing three states (labeled "1", "2", and "3"). These states can be characterized by any useful state variables. For instance, state 1 can be represented by storage coordinates ($R_1$, $P_1$). In addition, state 1 can also be represented by power-resistance angle $\theta_1$, which is the angle between the slope of the activation power-resistance curve and a baseline (here, shown as a dashed line at a power limit of about 0.6 mW).

As also shown in FIG. 5C, state 2 can be represented by a P-R angle of $\theta_2$, where $\theta_1 < \theta_2$, in order to distinguish states 1 and 2. State 2 can be represented by other storage coordinates, such as a set of points ($r_{n-i}$, $p_{n-i}$) (e.g., ($r_{2-1}$, $p_{2-1}$) to ($r_{2-4}$, $p_{2-4}$)) along the path of curve 2, where r is a resistance value along the $n^{th}$ curve, p is a power value along the $n^{th}$ curve, n is an integer, and i is the number of points along the $n^{th}$ curve required to differentiate each curve; as well as the slope $\delta P_2/\delta R_2$.

State 3 shows an alternative storage coordinate, i.e., $f_3(R,P)$ shown as a dashed arrow in FIG. 5C. Here, $f_3$ is a curve that is fit to the R-P data collected for state 3. This curve fit can be any useful curve model, including a non-linear regression model or a shell model, as described herein, employing any useful equation (e.g., any herein, as well as any using numerical simulations with multiple variable fits). As can be seen, each state can be represented by one storage coordinate or a combination of a plurality of different storage coordinates, such as an ($R_n$, $P_n$) coordinate; a set of distinct (R,P) coordinates (i.e., a set of ($r_{n-i}$,$p_{n-i}$)) for each data curve; a slope $\delta P_n/\delta R_n$; a power-resistance angle $\theta_n$; and/or a fit $f_n(R,P)$. One or more of these storage coordinates may be employed to characterize a single bit of information.

Figure 5B:
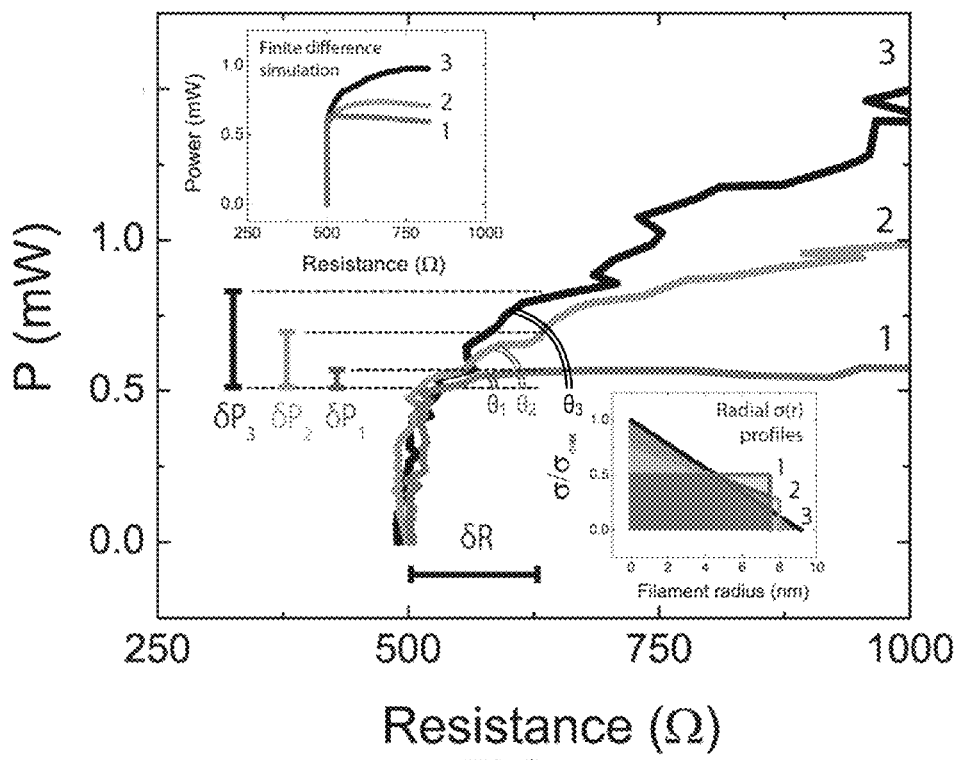
Figure 5C:
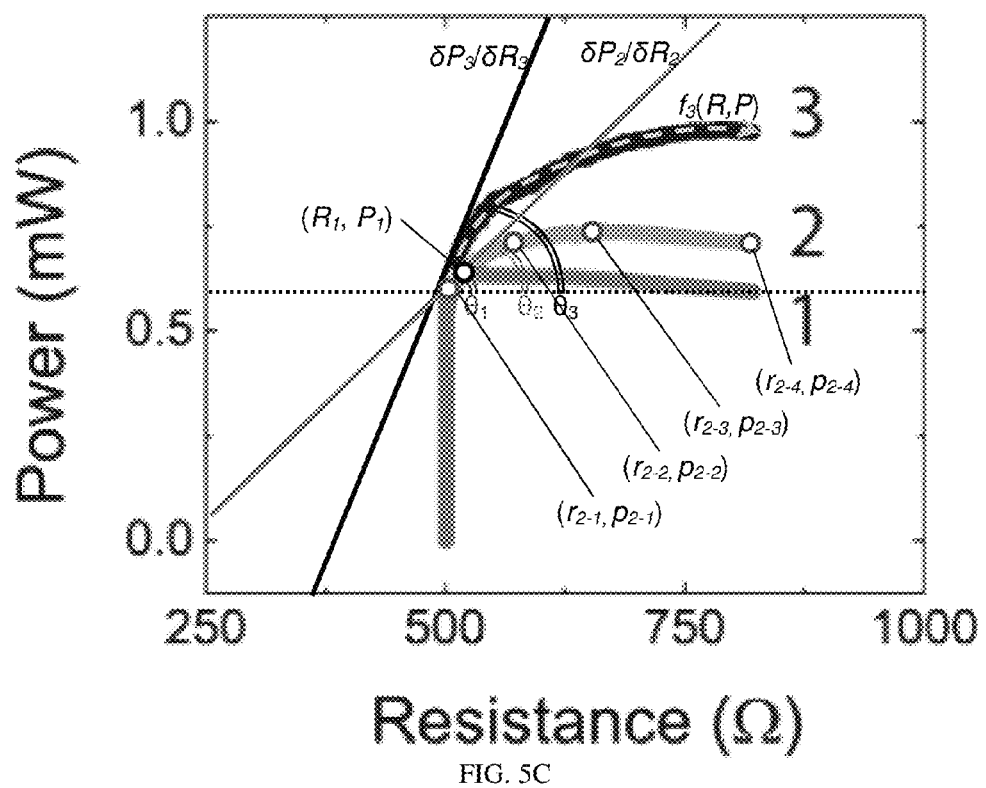

Data provided in FIG. 5B show that various storage coordinates can be separately written and read. Power-resistance switching curves are shown for multiple radial conductivity profiles (curves labeled "1", "2", and "3"), resulting from multiple concatenations of additional filaments which lead to an approximately continuous variation in the radial conductivity profile. A finite difference thermal switching simulator was shown to reproduce the observed P-R switching characteristics (upper inset, FIG. 5B), as a result of the shown radial concentration profiles (lower inset, FIG. 5B).

To obtain a thermal profile having differing $\delta P_n/\delta R_n$ or $\theta_n$ or $f_n(R,P)$, each bit can be represented by a conductive filament having a graded distribution of filament radii $\sigma_n$. For instance, power can be cycled to intentionally create graded distributions or radii within radii (see lower inset in FIG. 5B). Additionally, the thermal profile, and therefore the shape of the thermally activated region, can be controlled by changing the temperature surrounding the device. All of these effects can be mathematically modeled through a set of constitutive equations for filamentary memristors. These alternate geometry states can be differentiated by the manner in which their resistance changes with power once sufficient power for thermal activation is achieved. Use of varied concentration gradients, in addition to radius and conductivity, increases experimental complexity but may provide a third dimension for storage in information space.

These described dimensions are by no means the ultimate limit for information storage in resistive memory. It becomes more complicated to depict physically, but the curvature, or any other distinguishable effect observed in the power-resistance path after activation could potentially be used as an independent dimension. One physically intuitive approach we have not yet mentioned involves the vertical dimension within the device. Varying conductivity vertically in addition to radially provides an independent axis of information storage that may detectably alter the path through the power-resistance phase space. Alternatively, information could be read by monitoring interface effects at either electrode or within the device itself.

Memory Resistor Switching

Figure 6B:
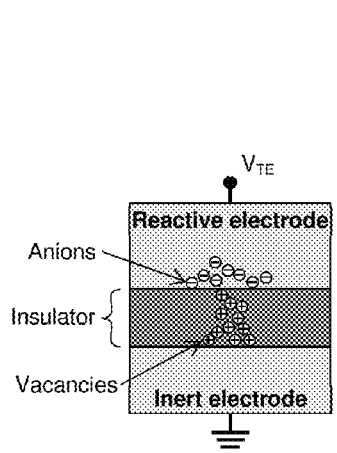
Figure 6C:
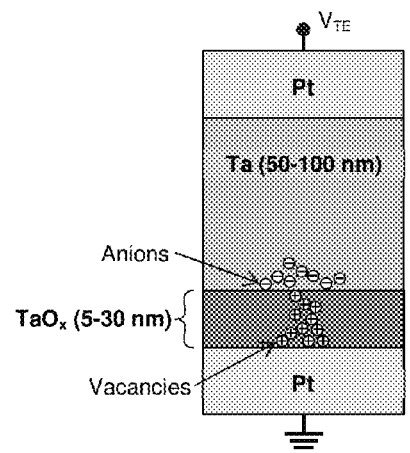

The present invention employs memristors to write, store, and read information. In particular, switching of the memristor to ON and OFF states provides a conductive filament. As shown in FIG. 6A, the different states and switching can be represented on an P-R coordinate system or an I-V coordinate system. Exemplary memristors are shown in FIG. 6B-6C, which are further described below.

Figure 7A:
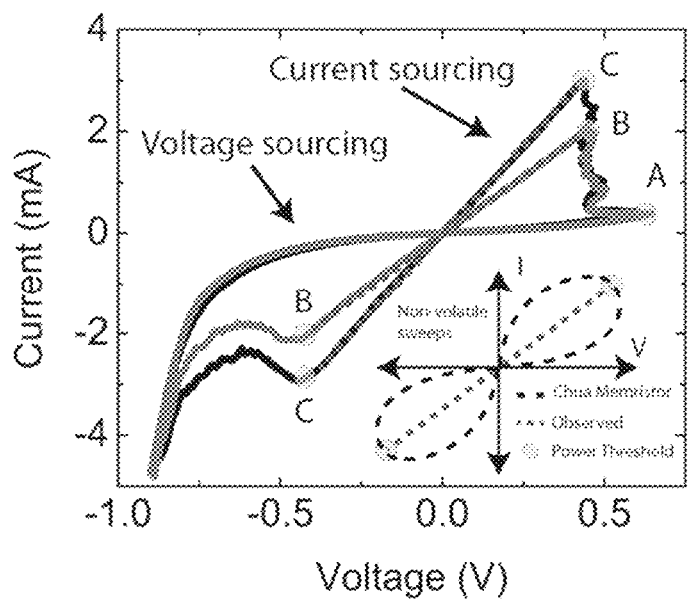
FIG. 7A-7B provides hysteresis curves and heat flow diagram of memristor switching. (A) Current-voltage (I-V) hysteresis curves are shown for two compliance current limits. Both hysteresis curves show sharp I-V end-points (labeled "A", "B", and "C"), in contrast to a canonical Chua memristor having smooth endpoints (inset). (B) Provided is a schematic of heat flow for a conducting filament of radius $r_F$ in an insulating environment. Heat flow is decomposed into two components: $Q_r$ and $Q_z$, with $Q_{Tot}=Q_r+Q_z$. The temperature profile within the filament $T(r)$ results in a spatially varying local $\hat{z}$ heat flow $dQ_z$, while the constant surface temperature $T_S$ results in a constant radial heat flow $Q_r$.
Figure 7B:
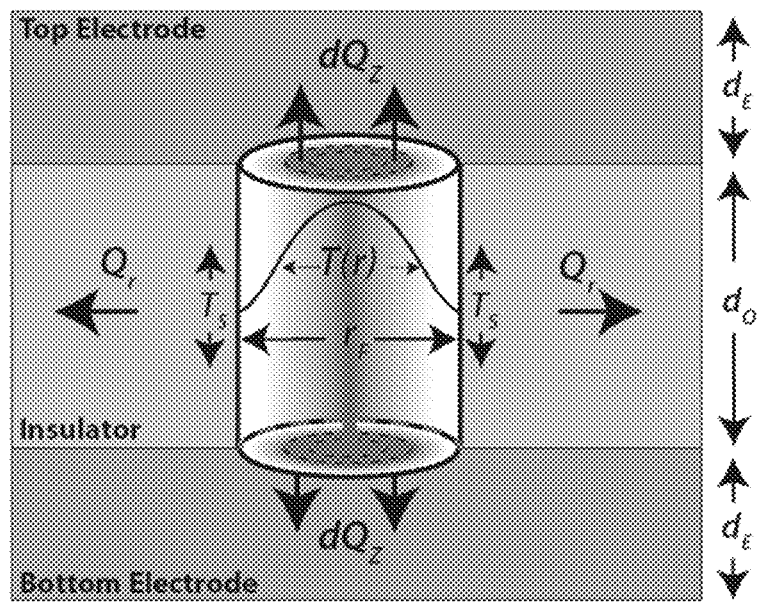
Figure 8:
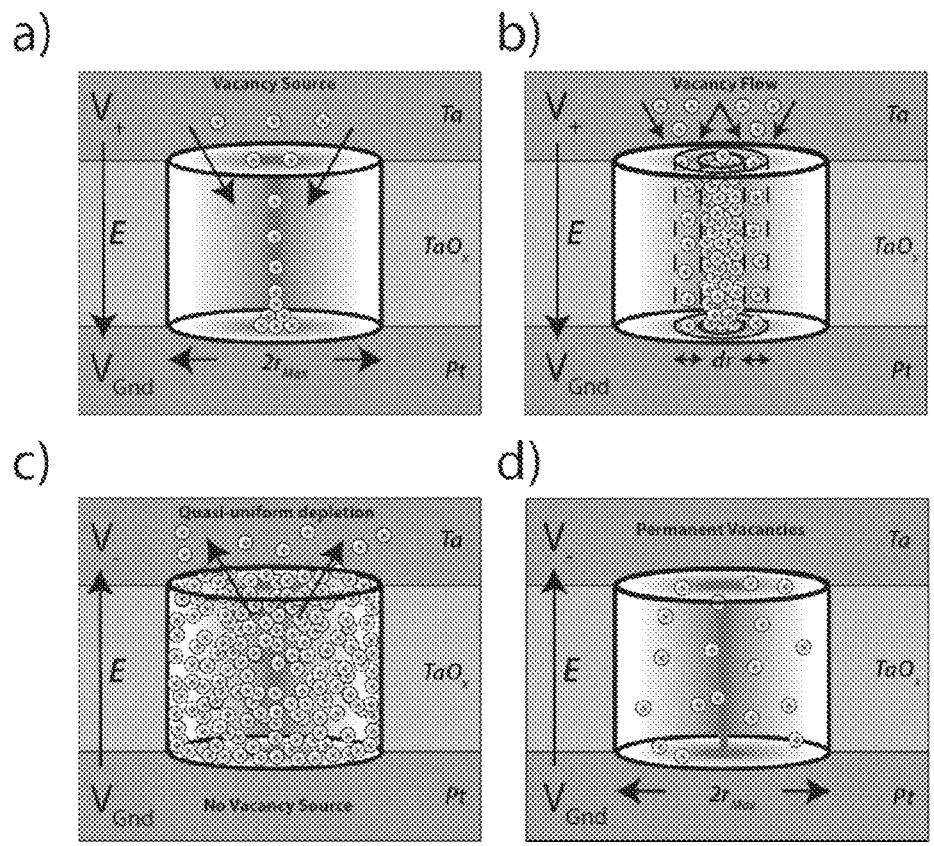
FIG. 8 shows schematics of microscopic ionic flux in a memristor. a) During ON switching ($V_+$ on top reactive electrode of Ta), vacancies first flow in the hot filament center and "pile-up" at the bottom electrode interface due to the insolubility of $O^2$ in the bottom inert electrode of Pt. b) Once vacancy saturation is reached inside a core filament radius, additional vacancy flux acts to increase the filament radius within the insulator $TaO_x$. c) During OFF switching ($V_-$ on top electrode), vacancy saturation no longer limits ion motion, and because Pt has no reservoir of vacancies, the filament is quasi-uniformly depleted. d) After vacancy depletion has completed, some permanent vacancy locations remain.

Memristor switching can be modeled as a thermally activated system. FIG. 7A shows hysteresis curves having two different I-V end-points (points "B" and "C"), where the resistive switching was current-limited for ON switching and voltage-limited for OFF switching. Ideally, memristors should display the canonical figure-8 switching curve, as shown in the inset of FIG. 7A. This canonical curve is rarely observed. Rather, as seen in FIG. 7A, switching data usually display sharp end-points, suggesting a more dynamic process for filament switching. FIG. 7B provides a thermal model, which accurately describes the observed switching dynamics (see fits shown as gray and white lines in FIG. 6A). In brief, the thermal model is a steady state model that compensates for Joule heat being generated and dispersed during filament formation. FIG. 8a-d provides a physical depiction of the microscopic ionic flux in multiple switching regimes described by the constitutive also described herein, including its ON switching (FIG. 8a), ON state (FIG. 8b), OFF switching (FIG. 8c), and OFF state (FIG. 8d). Additional details for this model and its constitutive equations are provided herein.

Memory Resistors (Memristors) and Arrays Thereof

Any useful memristors and arrays thereof may be employed. For instance, the memristor can include a top electrode, a bottom electrode, and an insulator disposed between the top and bottom electrodes. In one embodiment, the memristor includes a reactive electrode, an inert electrode, and an insulator disposed between the top and bottom electrodes (FIG. 6B). In another embodiment, the memristor includes a reactive Ta electrode, an inert Pt electrode, and a $TaO_x$ insulator disposed between the top and bottom electrodes (FIG. 6C). The memristor can further include a third electrode disposed on top of the reactive electrode. Any useful architecture may be employed.

The methods herein can be employed for memristors formed from a broad range of materials. Exemplary memristors include bipolar switching memristors, including those described in Yang J J et al., "Memristive devices for computing," *Nat. Nanotechnol.* 2013 January; 8:13-24; Balatti S et al., *Adv. Mater.* 2013; 25:1474-8; Burr G W, *IBM J. Res. Develop.* 2008 July; 52(4.5):449-64; Chang T et al., *ACS Nano* 2011; 5(9):7669-76; U.S. Pat. Nos. 8,395,926 and 8,450,711; as well as U.S. Pub. Nos. 2011/0169136 and 2014/0027705, each of which is incorporated herein by reference in its entirety Any useful insulator capable of transporting vacancies, cations, and/or anions may be employed. Exemplary insulators include transition metal oxide (TMO) films containing mobile oxygen ions, metal cations, and/or oxygen vacancies, such as $TiO_2$, $Ta_2O_5$, $WO_3$, $HfO_2$, $ZrO_2$, $SrTiO_3$, $MoO_3$, NiO, $Al_2O_3$, AlNO, and $Nb_2O_5$. Other materials are described in Yang J J et al., "Memristive devices for computing," *Nat. Nanotechnol.* 2013 January; 8:13-24 and Wong H S P et al., "Metal-oxide RRAM," *Proc. IEEE* 2012 June; 100(6):1951-70, each of which is incorporated herein by reference in its entirety.

Other insulators include $M_aO_b$, where M is a transition metal (e.g., a metal present in the resistive switching element); and each of a and b is, independently, an integer of from 1 to 5. In other embodiments, M is a transition metal (e.g., any in groups IV-X, such as Ti, Zr, Hf, V, Nb, Ta, Mo, W, Tc, Re, Co, Rh, Ir, Ni, Pd, or Pt). In yet other embodiments, the insulator includes $M_2O$, where M is a transition metal (e.g., any in groups IV-X, such as Ti, Zr, Hf, V, Nb, Ta, Mo, W, Tc, Re, Co, Rh, Ir, Ni, Pd, or Pt).

Electrodes can be formed from any useful material. In particular, a conductive element serves as an electrode and is typically made from electrically conductive metals (e.g., tungsten (W), tungsten nitride (WN), gold (Au), silver (Ag), copper (Cu), chromium (Cr), platinum (Pt), iridium (Ir), nickel (Ni), silicon (Si), silicon carbide (SiC), molybdenum (Mo), cobalt (Co), ruthenium (Ru), titanium (Ti), titanium nitride (TiN), titanium aluminum nitride (TiAlN), aluminum (Al), hafnium (Hf), strontium (Sr), tantalum (Ta), and tantalum nitride (TaN), as well as doped forms, alloy forms, amorphous forms, crystalline forms, and laminated forms thereof). Exemplary electrode pairs include an active electrode formed from an electrochemically active or oxygen reactive material (e.g., Ta) and an inert electrode formed from an electrochemically inert material (e.g., Pt). Other non-limiting electrochemically active or oxygen reactive materials include Ag, Cu, Ni, Ta, Hf, Ti, Sr, or alloys and combined forms thereof, such as CuTe, $SrRuO_3$, or TiN; and electrochemically inert materials include W, Pt, Au, Mo, Co, Cr, Ru, Ir, doped poly-Si, TiW, TiN, or TaN.

The components of the device can be formed by any useful process. Exemplary processes include reactive sputtering, sputtering, chemical vapor deposition (CVD), pulse laser deposition (PLD), atomic layer deposition (ALD), gas cluster ion beam (e.g., as described in U.S. Pub. No. 2012/0104347, which is incorporated herein by reference in its entirety), photolithography, lift-off, etching, electron beam lithography, spin coating, dip coating, spraying, roller coating, electroplating, etc. As those skilled in the art will appreciate, various alternative deposition methods may be useful in this regard, which collectively include sputtering, CVD, atomic layer deposition (ALD), and evaporation. Additional processes and materials are described in U.S. Pat. No. 7,129,133, Lohn A J et al., "Optimizing TaO$_x$ memristor performance and consistency within the reactive sputtering "forbidden region"," *Appl. Phys. Lett.* 2013; 103:063502; Lohn A J et al., "A CMOS compatible, forming free TaO$_x$ ReRAM," *ECS Trans.* 2013; 58(5):59-65; and Lohn A J et al., "Stages of switching in tantalum oxide memristor," *IEEE Intl Memory Workshop*, held 26-29 May 2013 in Monterey, Calif. (4 pp.), each of which is incorporated herein by reference in its entirety.

Figure 10:
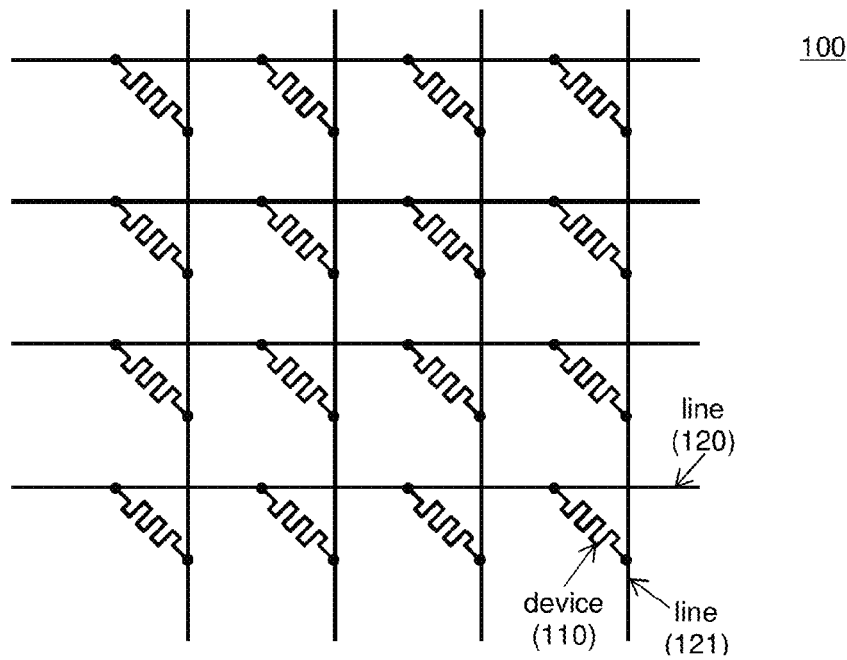
FIG. 10 is a schematic of an exemplary memory including an array 100 of resistive memory devices 110.
Figure 11:
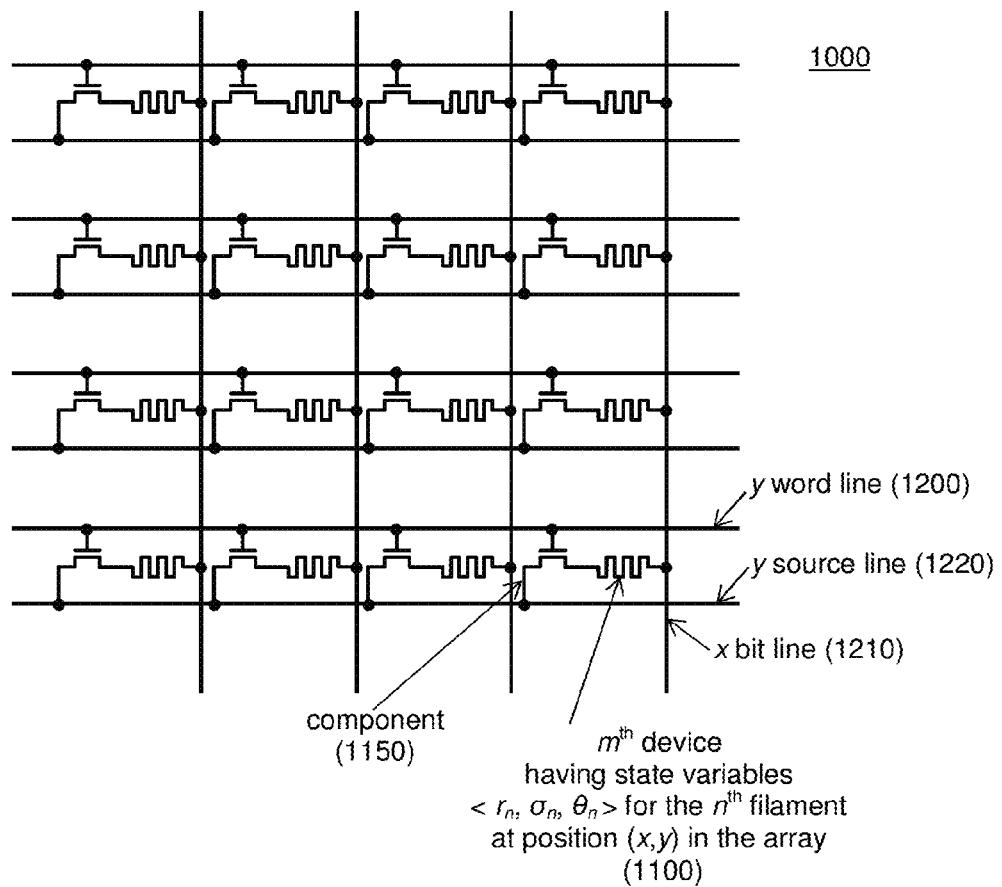
FIG. 11 is a schematic of another exemplary memory including an array 1000 of resistive memory devices 1100 and components 1150.

Memristors can be provided in any useful format and include any other useful components in any useful architecture (e.g., serial and/or parallel schemes). For instance, an array (e.g., a cross-bar array) can include a plurality of memristor devices, where each device is electrically connected to a source and/or a sourcemeter by a line. As shown in FIG. 10, the array 100 can include a plurality of devices 110 connected electrically by one or more lines 120, 121. In yet another embodiment, as shown in FIG. 11, the array 1000 can include a plurality of m devices 1100 and a plurality of m components 1150, each connected electrically by a word line 1200, a source line 1220, and a bit line 1210. Exemplary components include a transistor (e.g., a MOSFET), an amplifier, a decoder, a capacitor, a comparator, a modulator, a switch, a diode, or any other useful electrical component. Any useful number of components and lines may be present. For instance, the array can include x×y=m devices including x bit lines, y word lines, and y source lines, where each of x and y is an integer more than 1.

State Variables and Storage Coordinates

The state of the device is controlled by the presence of the conductive filament, which is created upon switching the device. In turn, state variables describe one or more characteristics of the filament, and each bit of information includes a combination of one or more state variables. Storage coordinates are measurable data, and the value of the storage coordinates correspond to particular state variables or particular combinations of state variables.

Any useful state variable(s) or combinations of such variables may be employed. Exemplary state variables include geometry of the filament, e.g., a filament radius $r_n$ for an $n^{th}$ filament, a graded distribution of radii for filament having a concentric set of q filaments each having a radius of $r_q$, a cylindrical filament having a radius $r_n$, or a cone-shaped filament having a base radius $r_{nb}$; and/or filament composition, such as a filament conductivity $\sigma_n$ for an $n^{th}$ filament or a radial conductivity $\sigma_{r,n}$ for an $n^{th}$ filament at a radial position ρ (e.g., where ρ is any value between 0 (i.e., at the center of the filament) and $r_n$ (i.e., at the edge of the filament)); and a dynamic feature, e.g., a power-resistance angle $\theta_n$ for an $n^{th}$ filament.

Each state can be represented by one storage coordinate or a combination of a plurality of different storage coordinates, such as an $(R_n, P_n)$ coordinate; a set of distinct (R,P) coordinates (i.e., a set of $(r_{n-i}, p_{n-i})$) for each data curve; a slope $\delta P_n/\delta R_n$; a power-resistance angle $\theta_n$; and/or a fit $f_n(R,P)$. One or more of these storage coordinates may be employed to characterize a single bit of information.

Methods for Creating Gradually Changing Resistance Values

The resistance changes by modulating the conductivity profile of a conducting filament. The conductivity profile of the filament determines the resistance, but it also determines the temperature profile of the device. The temperature profile determines which regions of the conductivity profile are allowed to change. If the entire filament changes simultaneously then it is difficult to precisely control the resistance. However, if only a small region of the filament is able to change at any given time, then it is much easier to control the resistance. As discussed below, we are able to control the conductivity profile, which allows us to control the temperature profile and, in turn, allows us to control the regions of the filament that can change. Thus, resistance can be controlled precisely.

In FIG. 5B, the conductivity profile for curve 1 is generally flat, which causes abrupt changes in resistance. Putting a step in the conductivity profiles puts a step in the electrical behavior, providing enhanced resistance control. In some embodiments, many steps can give a smooth conductivity profile (as shown in curves 2 and 3 in FIG. 5B), which equates to smooth resistance control.

For a smooth conductivity profile, the filament can be configured to have a radially changing conductivity. For instance, the filament can include a radial profile σ(r) having a higher σ in the center of the filament (i.e., at filament radius of 0 nm in the lower inset of FIG. 5B) and a lower σ at the edge of the filament (i.e., at filament radius of 8 nm for filament 2 in the lower inset of FIG. 5B). Between the center and edge of the filament, conductivity σ can vary in any useful manner, either linearly, exponentially, curvilinearly, etc.

A smooth conductivity profile can result from a filament composed of at least two concentric filaments. An exemplary process of creating such a filament is as follows. With the inert electrode grounded, ON switching occurs by applying positive voltage on the reactive electrode, and OFF switching occurs by applying negative voltage on the reactive electrode. A first filament with a large radius and low conductivity is formed. This is achieved in two steps, first, the device is turned ON (resistance decrease) to a desired stopping point $P_{R1}$ corresponding to a specific radius, where more ON or lower resistance means larger radius. Second, the device is turned partly OFF (resistance increase) until a first desired set point $P_{C1}$ by decreasing the conductivity at the radius that was previously determined. This radius and conductivity combination is the bottom step of the conductivity profile.

Then, a second filament is formed, where this second filament is contained within the center of the first filament. The second filament is formed by performing the steps above but for smaller radius and larger conductivity. Namely, the device is turned partly ON, thereby starting to develop a new region of high conductivity within the previously-made first element. Specifying the stopping resistance during ON switching to a desired stopping point $P_{R2}$ specifies the radius of the second step, and specifying the stopping resistance during OFF switching to a desired set point $P_{C2}$ specifies the conductivity of the second step.

This process can be repeated to create many steps or an approximately smooth conductivity profile. The resistance during each ON switching half-cycle must not get to a value as low as the previous ON switching half-cycle or the new step will widen the previous one.

Similarly, the resistance during each OFF switching half-cycle must not get to a value as high as the previous OFF switching half-cycle or the new step will start to decrease the conductivity level of the previous step.

EXAMPLES

Example 1

Memristors—Extending Moore's Law into Hidden Dimensions

Moore's law, the exponential increase in transistor density, has been the driving force for the technological revolution that has occurred over the past decades, but it has become increasingly difficult to continue, leading to a broad search for new approaches (Dieny B et al., "Emerging non-volatile memories: magnetic and resistive technologies," *J. Phys. D: Appl. Phys.* 2013; 46(7):070301; Ielmini D, "Reliability issues and modeling of Flash and post-Flash memory," *Microelectron. Eng.* 2009 September-July; 86(7-9):1870-5; and Burr G W, "Overview of candidate device technologies for storage-class memory," *IBM J. Res. Develop.* 2008 July; 52(4.5):449-64).

Memristors (also known as ReRAM, see Chua L O, "Memristor—The missing circuit element," *IEEE Trans. Circuit Theory* 1971 September; 18(5):507-19; and Strukov D B et al., "The missing memristor found," *Nature* 2008 May; 453: 80-3) have been proposed among the leading candidates to replace transistors, in part, due to their ability to store information within a range of resistances instead of a simple digital ON or OFF (Kim H et al., "Memristor-based multilevel memory," 2010 12*th Int'l Workshop on Cellular Nanoscale Networks and Their Applications (CNNA)*, held on 3-5 Feb. 2010, in Berkeley, Calif., pp. 1-6; and Manem H et al., "A read-monitored write circuit for 1T1M multi-level memristor memories," 2011 *IEEE Int'l Symp. on Circuits and Systems (ISCAS)*, held on 15-18 May 2011 in Rio de Janeiro, pp. 2938-41).

We show that this approach to multi-state memory drastically understates the information storage capacity of these devices. Each resistance state can, in fact, be decomposed into separate geometry and composition components, which can be independently controlled and measured (see Example 2 herein and Lohn A J et al., "Degenerate resistive switching and ultrahigh density storage in resistive memory," arXiv: 1406.4033 [cond-mat.mtrl-sci], accessible from arxiv.org/abs/1406.4033). Further, these states can be decoupled from their physical origin to be set and read using the resistance and the power required for thermal activation as state variables. This change greatly simplifies both the set and read operations. Using standard tantalum oxide devices and a simple approach to read and write, we demonstrate multi-state storage in multi-dimensional information space and suggest approaches to expand into even more hidden dimensions.

Information space in digital systems is zero-dimensional, where a single state can exist or not exist. Resistive memory, like several other device structures can be thought of as one-dimensional in information space, where information can be stored as a point along any of a range of possible resistance states (Gao X M et al "An innovative sensing architecture for multilevel Flash memory," 2012 *IEEE 11th Int'l Conf on Solid-State and Integrated Circuit Technol. (ICSICT)*, held on 29 Oct. 2012-1 Nov. 2012, in Xi'an, pp. 1-3; Garcia V et al., "Electronics: Inside story of ferroelectric memories," *Nature* 2012 March; 483:279-81; and Panagopoulos G et al., "Exploring variability and reliability of multi-level STT-MRAM cells," 2012 70*th Annual Devices Res. Conf (DRC)*, held on 18-20 Jun. 2012 at University Park, Tex., p. 139-40).

Example 2 herein shows that the resistance state in filamentary memristive systems can be set either by varying the radius or the conductivity of a cylindrical filament separately. In doing, the individual resistance states are, in fact, two-dimensional in information space. Although a single resistance is measured, it is composed of two separately tunable dimensions, namely, geometry and conductivity. A range of dimensionalities in information space are depicted in FIG. 1 where, based on the above argument, memristors should be viewed as an implementation in two-dimensions though it may be possible to expand into more, possibly many more dimensions.

It has also been shown that the dominating physics in these devices is thermal activation, which enables steady-state analog operation, using power limited switching to control the device (i.e., current control for resistance reduction and voltage control for resistance increases). The steady-state method of operation makes stable and precise selection of specific resistances possible and allows the same resistance value to be set to various radius-conductivity combinations.

In this simple two-dimensional information space, radius and conductivity are the two separate state variables. Increasing positive current (inert electrode grounded) to decrease resistance injects oxygen vacancies from the reactive electrode until the concentration saturates. After saturation, further increases in positive current increase the radius of the saturated region. Applying a negative voltage to increase resistance draws oxygen vacancies back into the reactive electrode. By varying the positive power and negative power sequentially, the resistance can be set, as shown in FIG. 2A-2C, to a range of radius-conductivity combinations.

Although it is physically intuitive to span information space using radius and conductivity, it is more practical to consider the electrical power and resistance. Resistance can be easily read electrically, and since the thermal profile depends on both geometry and conductivity, the power required to reach thermal activation can be used to read the second dimension in information space. Sweeping power in the positive and negative directions alternately allows one to set the resistance and the electrical power required for thermal activation separately. Additionally, operating in power and resistance gives specific set points that can be reproduced even if the filament properties change with cycling. In that way, the storage locations are unaffected by issues such as device degradation that may affect geometry and conductivity. Degradation effects may limit the range of states but do not affect their location in the power-resistance information space.

To experimentally demonstrate storage in two-dimensional information space (FIG. 4B), we used tantalum oxide memristors fabricated using a completely CMOS compatible process (Lohn A J et al., "Optimizing $TaO_x$ memristor performance and consistency within the reactive sputtering "forbidden region"," *Appl. Phys. Lett.* 2013; 103:063502; and Lohn A J et al., "A CMOS compatible, forming free $TaO_x$ ReRAM," *ECS Trans.* 2013; 58(5):59-65). A simple Labview program controlled an Agilent 4156B for all tests. Power was applied in long duration pulses, well in excess of the anticipated switching times (Torrezan A C et al., "Sub-nanosecond switching of a tantalum oxide memristor," *Nanotechnology* 2011; 22(48):485203).

The devices were then allowed to cool between pulses, so each data point should be viewed as an independent read and write cycle. For the purpose of visual clarity, in this simple proof of principle experiment, we only include approximately 100 states, but it is apparent from FIG. 4B that much larger state densities are possible. Even at such low state density per dimension, this single memristor displaces approximately seven (7) digital bits. With sensitive electronics operating in steady state, it should be possible to extend the number of states per dimension greatly to achieve state densities well beyond what we show here.

In the most general case, the written state and the read state are not identical. Even in the standard approach which uses only resistance levels for one-dimensional data storage, increasing emphasis is being placed on use of resistance states that are non-linear with voltage to avoid potential "sneak path" issues. This non-linearity is desirable but implies that the measured resistance at the write voltage is different from the measured resistance of the same state at the read voltage. A similar effect is present in the write-read relationship for activation power. The activation power can be read by increasing voltage, current or power until thermal activation is achieved and the resistance state changes. For a perfectly cylindrical filament the temperature is highest in the center so, with less power than is required to activate the entire filament, a small segment of the cylinder near the center will become activated and allow for resistance changes. In terms of implementation, the read powers can be stored in a lookup table or converted via the following equation, which can be derived from the equations detailed in Example 2 for a cylindrical filament:

$$V_{READ} = V_{SET} \sqrt{\frac{\frac{d_E}{k_E d_O}\left[1 - \frac{k_E r_F^2}{4 k_F d_E d_O}\right]}{\frac{r_F^2}{2 k_F d_O^2} + \frac{d_E}{k_E d_O}\left[1 - \frac{k_E r_F^2}{4 k_F d_E d_O}\right]}}, \quad \text{(Eq. 2)}$$

where $d_E$ and $d_O$ are the electrode and oxide thickness respectively, $k_E$ and $k_F$ are the electrode and filament thermal conductivity respectively, and $r_F$ is the filament radius. These parameters can all be designed for and can all be measured quickly and easily.

A careful look at Eq. 2 shows that if $$\frac{d_E}{k_E} \gg \frac{r_F^2}{2 k_F d_O},$$

then the read voltage reduces to the set voltage. Our fabrication process results in devices where this simplifying approximation is not justified, but it may be possible to alter device design to meet this criterion. The most convenient approach to do so involves increasing the thermal resistance of the electrode. It should be noted that the above relation and simplifying assumption were derived by modeling the thermal resistance using $k_E$ and $d_E$ as continuum parameters to define electrode thermal resistance but the thermal resistance is likely dominated by interfacial effects. Use of high thermal mismatch electrodes is therefore a probable route toward satisfying this inequality.

Increasing thermal resistance of the electrodes will simplify the read step for activation power as discussed above but has a number of additional benefits. Increasing electrode thermal resistance increases the maximum resistance and decreases the minimum resistance. A larger dynamic range is therefore created for storing additional states and the increased maximum resistance means the devices can be read at lower powers. Write powers are also reduced because the increased thermal resistance drives temperature up by holding in heat. Electrode thermal resistances should be increased for these reasons, irrespective of the simplification it affords in reading multi-dimensional devices.

Although not a necessity, it is still possible to read and write at the same activation power, even in the absence of the electrode modifications discussed above. If the temperature profile can be made flat, then the entire filament will be activated at a single power which is equal to both the read and write power. Following the radius-increase phase of ON switching, partial OFF switching can be used to achieve that flat temperature profile. In the first stages of OFF switching, the temperature is highest at the center so the electrical conductivity is reduced there first. Current density is then moved to the surrounding region where temperatures there rise and core temperature drops. This negative feedback process progresses until a conductivity profile exists that is self-arranged to create a flat temperature profile. Therefore, over a reduced range of states, the write and read powers will be identical, even without the modification for thermally resistive electrodes.

Of course, maximizing storage in multi-dimensional information space is a daunting and multi-faceted engineering challenge. The number of states is determined by their density and the range from minimum to maximum values (FIG. 5A, right). As discussed above, the range of states can be increased by increasing electrode thermal resistance, but many other approaches can be easily derived from the memristive constitutive relations. Over a defined range of states, bit density in any one dimension will be limited by a variety of issues. Atoms will gradually diffuse, causing the individual states to drift slightly. The activation temperature in tantalum oxide is greater than 1000° C. (Strukov D B et al., "Thermophoresis/diffusion as a plausible mechanism for unipolar resistive switching in metal-oxide-metal memristors,"*Appl. Phys. A* 2012; 107:509-18; and Larentis S et al. "Filament diffusion model for simulating reset and retention processes in RRAM," *Microelectron. Eng.* 2011 July; 88(7):1119-23), which implies that at standard operating temperatures this thermal drift should be relatively small.

Also, the resolution in setting or reading the states may be limited by the steepness of the temperature profile, which determines the regions in the device that are thermally activated. Increasing temperature profile steepness can be achieved by decreasing temperature surrounding the device, which suggests a method to increase state density. Noise and sensitivity in both the read and write circuitry will also likely present limitations to be overcome, but the use of steady-state power-limited control circuitry greatly enhances the sensitivity of both read and write, enabling nearly immediate access to large state densities.

It is worth reiterating that these devices require no changes to the current processes that ReRAM manufacturers around the world already have in place. It is also worth reiterating the simplicity of the methods for reading and writing these large numbers of states. We require only that power and resistance be controlled and measured. The power can be limited by using current control when reducing resistance and by using voltage control when increasing resistance or by designing specialized power control circuitry. The ideas presented here can therefore be rapidly integrated into the current ReRAM technology.

We have shown that since conductivity and radius of the conducting filament in a memristive device can be separately controlled and measured, memristors should be viewed as multi-dimensional in information space. We demonstrated a simple approach to writing and reading these variables with precision and reproducibility by spanning the space in resistance and thermal activation power instead of radius and conductivity. Spanning the space in this way increases the ease of interacting with the device and provides a reproducible method for storing and retrieving data even if the physical properties of the device change over time. Although we only demonstrate multi-dimensional storage in two dimensions, we propose that many others should be possible. The search for new dimensions, and our expansion into them, ushers in a new era in information storage and a path forward beyond Moore's Law.

Example 2

On the Physics and Design of Filamentary Memristors

Memristors, as 'fundamental' passive circuit elements (Chua L O, *IEEE Trans. Circuit Theory* 1971 September; 18(5):507-19; and Strukov D B et al., *Nature* 2008 May; 453:80-3), are reshaping computing paradigms as the leading candidate for the future of computer memory, as well as by enabling entirely new approaches to circuitry [neural] (Burr G W, *IBM J. Res. Develop.* 2008 July; 52(4.5):449-64; Waser R et al., "Nanoionics-based resistive switching memories," *Nat. Mater.* 2007; 6(11):833-40; and Yang J J et al., "Memristive devices for computing," *Nat. Nanotechnol.* 2013; 8(1): 13-24).

The most prevalent class of memristors are those in which the formation and modification of a nano-scale conducting filament controls the resistance state of the device, and a world-wide research effort has raced to provide detailed characterizations to aid design insight. However, due to the similarity between the filament and its surroundings, and the virtually inaccessible length scales, characterizations have required prohibitive experimental effort (Waser R et al., *Nat. Mater.* 2007; 6(11):833-40; Yang J J et al., *Nat. Nanotechnol.* 2013; 8(1):13-24; Waser R et al., "Redox-based resistive switching memories—nanoionic mechanisms, prospects, and challenges," *Adv. Mater.* 2009; 21(25-26):2632-63; Larentis S et al., "Resistive switching by voltage-driven ion migration in bipolar RRAM—Part II: Modeling," *IEEE Trans. Electron Devices* 2012 September; 59(9):2468-75; and Kwon D H et al., "Atomic structure of conducting nanofilaments in $TiO_2$ resistive switching memory," *Nat. Nanotechnol.* 2010; 5(2):148-53).

The challenge is increased by the importance of thermal behavior, which is particularly difficult to measure at such small length and time scales (Strukov D B et al., *Appl. Phys. A* 2012; 107:509-18; Mickel P R et al., "A physical model of switching dynamics in tantalum oxide memristive devices," *Appl. Phys. Lett.* 2013; 102:223502; Strukov D B et al., "Exponential ionic drift: fast switching and low volatility of thin-film memristors," *Appl. Phys. A* 2009; 94(3):515-9; Lu Y M et al., "Impact of Joule heating on the microstructure of nanoscale $TiO_2$ resistive switching devices," *J. Appl. Phys.* 2013; 113(16):163703; and Larentis S et al., *Microelectron. Eng.* 2011 July; 88(7):1119-23). Here, we derive from first principles and experimentally validate a set of constitutive equations which govern the steady state operation of filamentary memristive devices.

This simple and quantitatively powerful result provides the framework to understand these devices and to predictively tailor their operation. We show that by measuring a single hysteresis loop, the constitutive equations analytically determine the four most important physical parameters of the conducting filament (composition, radius, temperature, and surrounding thermal resistance) across a continuum of resistance states. This technique enables any researcher with a voltage/current source meter to easily measure the internal structure and behavior of the device in response to experimentation. Furthermore, these equations provide design rules and operational guidelines while describing limiting behavior for a broad range of relevant parameters and phenomena such as: power requirements, scaling limits, number of bits per device, and multiple filament detection.

Canonical memristive systems, as predicted by Chua (*IEEE Trans. Circuit Theory* 1971 September; 18(5):507-19), modify their resistance state according to the history of applied voltage flux, resulting in a smoothly varying, pinched I-V hysteresis loop (see inset of FIG. 7A). However, memristors based on nanoscale conducting filaments seldom display this canonical curvature, suggesting they are governed by more sophisticated physics. Thermal activation is widely speculated to be central to the switching process, where, beyond a critical temperature, $T_{Crit}$, competing dynamics act to redefine the radius and/or composition of the filament. Considering this, the onset of switching in a hysteresis curve may be interpreted as the point where diffusion/switching is thermally activated ("A" in FIG. 7A). Under this framework, decreasing power would lower temperature below $T_{Crit}$, thereby halting switching and producing the experimentally observed sharp I-V end-points which are observed experimentally but absent in classical memristors (see points "B" and "C" in FIG. 7A).

Perhaps even more interesting is that these sharp IV end-points can exist at all points throughout the switching process. FIG. 7A shows hysteresis curves, where the resistive switching was current-limited for ON switching and voltage-limited for OFF switching. The different I-V end-points (points "B" and "C") apply significantly different Joule heat doses, however, both hysteresis loops exhibit equally sharp transitions, strongly implying that $T \approx T_{Crit}$ at each point. This suggests the presence of rich thermal physics which provides a self-limiting, unidentified negative feedback mechanism that keeps the system on the edge of thermal activation regardless of the total power dissipation in the device.

Thermal Derivation:

To gain further insight into the governing thermal physics and explore this phenomenon, we developed a first principles heat flow model. In steady state, Joule heat is generated uniformly in a cylindrical conducting filament and flows out both vertically through the electrodes and radially through the surrounding oxide: $Q_{Tot} = IV = Q_r + Q_z$ (see FIG. 7B).

In steady state, Joule heat is generated uniformly in a cylindrical conducting filament and flows out both vertically through the electrodes and radially through the surrounding oxide: $Q_{Tot} = IV = Q_z + Qr$. Integrating vertical heat determines $Q_z$, but requires knowledge of the temperature profile within the filament. Solving the heat equation in cylindrical coordinates as a function of radius r (Incropera F P, "Fundamentals of Heat and Mass Transfer," 6th ed. 2002: John Wiley & Sons) and with uniform heat generation gives the following:

$$T(r) = \frac{\sigma V^2 r_F^2}{4 d_O^2 k_F}\left(1 - \frac{r^2}{r_F^2}\right) + T_S, \quad \text{(Eq. 3)}$$

where $\sigma$ is the electrical conductivity, V is the voltage across the device, $d_O$ is the thickness of the oxide insulator, $r_F$ is the filament radius, $k_F$ is the thermal conductivity of the filament, $T_S$ is the temperature on the outer radial surface of the filament (see temperature profile in FIG. 7B), and the filament is assumed to be cylindrical. Approximating the local $\hat{z}$ thermal conductance as, $dG_{Tz} = k_E dA/d_E$ (where $d_E$ is the electrode thickness, $k_E$ is the thermal conductivity of the electrode, dA is a differential area of the filament, and $T_{RT}$ is room temperature), we calculate the total $\hat{z}$ heat flow as:

$$Q_Z = 2\int_0^{2\pi}\int_0^{r_F} \frac{(T(r) - T_{RT})k_E}{d_E} r\, dr\, d\theta = \quad \text{(Eq. 4)}$$

-continued $$\frac{\pi r_F^4 \sigma V^2}{4d_O^2 k_F} \frac{k_E}{d_E} + 2\pi r_F^2 \frac{k_E}{d_E}(T_S - T_{RT})$$

Regarding $k_E$, the effective thermal conductivity is expected to be larger than that of the electrode material itself because of the geometric factor resulting from the increased top electrode area.

With $Q_{Tot}$ and $Q_z$ known, $Q_r$ can be used to determine the radial surface temperature via a radial thermal resistance: $T_S - T_{RT} = Q_r R_{T,r}$. Defining $r_{RT}$ as the radius, where $T = T_{RT}$, $R_{T,r}$ may be calculated as: $R_{T,r} = \ln(r_{RT}/r_F)/2\pi d_O k_O$, where $d_O$ and $k_O$ are the thickness and thermal conductivity of the oxide, respectively.

Solving for $T_S$ gives:

$$T_S = T_{RT} + \frac{\frac{\sigma V^2 \ln(r_{RT}/r_F) r_F^2}{2d_O^2 k_O}\left[1 - \frac{k_E}{k_F}\frac{r_F^2}{4d_E d_O}\right]}{1 + \ln(r_{RT}/r_F)\frac{k_E}{k_O}\frac{r_F^2}{d_E d_O}}. \quad \text{(Eq. 5)}$$

Additionally, by noting that $$\ln(r_\infty/r_F)\frac{k_E}{k_O}\frac{r_F^2}{d_E d_O} \gg 1,$$

Eq. 5 may be simplified to:

$$T_S = T_{RT} + \sigma V^2 \frac{d_E}{2k_E d_O}\left[1 - \frac{k_E}{k_F}\frac{r_F^2}{4d_E d_O}\right], \quad \text{(Eq. 6)}$$

where $T_{RT}$ is room temperature, $\sigma$ is the electrical conductivity, V is the voltage across the device, $d_E$ is the electrode thickness, $k_E$ is the electrode thermal conductivity, $d_O$ is the thickness of the oxide insulator, $r_F$ is the filament radius, and $k_F$ is the thermal conductivity of the filament.

This simplification has important physical significance. In calculating $R_{T,r}$ we have ignored vertical heat flow in the surrounding oxide, and determining the value of $r_{RT}$ is difficult. However, this simplification, makes the functional form of $R_{T,r}$ and choice of $r_{RT}$ irrelevant, as they fall out of the equation completely.

Thus, by comparing the total Joule heat generation to the $\hat{z}$ heat flow through the electrodes, we determined the radial surface temperature $T_S$ of the conducting filament to be represented by Eq. 6 (FIG. 7B).

It is widely believed/speculated that ON switching (lowering resistance) is mediated by filament radius increases (see, e.g., Yang J J et al., *Nat. Nanotechnol.* 2013; 8(1):13-24; Waser R et al., *Adv. Mater.* 2009; 21(25-26):2632-63; and Larentis S et al., *IEEE Trans. Electron Devices* 2012 September; 59(9):2468-75). Considering this, the negative sign in Eq. 6 reveals the temperature limiting mechanism—as the filament radius increases, the temperature drops. The specific physical mechanism is surprisingly simple: because core temperatures increase with filament radius and heat transfer is proportional to $\Delta T$, vertical heat flow increases with radius faster than the uniform heat generation. As a result, less heat flows radially and the surface temperature decreases. However, ON switching is only half of the story.

Interrupting OFF switching (increasing resistance) at any point in the switching process produces similarly sharp, non-Chuan I-V end-points, again suggesting that an unidentified negative feedback keeps the system's temperature balanced at the edge of thermal activation. Considering Eq. 6, this experimental observation rules out filament radius changes as an OFF switching mechanism. Decreasing $r_F$ increases temperature, resulting in positive feedback which would cause the temperature to diverge rather than self-limit as experimentally observed. It is highly unlikely that parameters such as the electrode or oxide thickness change during switching, therefore, Eq. 6 strongly suggests that changes in conductivity (or equivalently, vacancy concentration) provide the self-regulation of temperature and control OFF switching, as lowering $\sigma$ directly lowers $T_S$.

Experimental:

To prove these hypotheses, we must experimentally show that temperature decreases with increasing filament radius and decreasing filament conductivity—a daunting task, as few (if any) experimental methods capable of measuring the temperature of a nanoscale filament exist, and current microscopy techniques provide only a single snapshot of filament geometry and composition. However, rewriting Eq. 6 as a set of constitutive equations defining the system's response to power dissipation provides a direct test of these hypotheses:

$$IV_{ON} = \frac{\frac{2k_E d_O}{\sigma d_E}\Delta T}{R_F - R_{min}} \quad \text{(Eq. 7a)}$$

and $$IV_{OFF} = \frac{\frac{8d_O^2 L_{WF} T_{crit}}{r_F^2}\Delta T}{R_{max} - R_F}, \quad \text{(Eq. 7b)}$$

where $\Delta T = T_{crit} - T_{RT}$, $$R_{min} \equiv \frac{k_E}{4\pi\sigma^2 L_{WF} T_{crit} d_E},$$

$$R_{max} \equiv \frac{4d_O^2 L_{WF} T_{crit} d_E}{\pi r_F^4 k_E},$$

$R_F = d_O/\sigma\pi r_F^2$, $\sigma$ and $r_F^2$ take on their maximum values throughout the switching process, and using the Wiedemann-Franz law the substitution, $k_F = \sigma L_{WF} T_{crit}$ has been made. With the substitution of the Wiedemann-Franz law, the exact surface temperature of the filament can be found by solving its quadratic equation:

$$T_S^2 - \left(T_{RT} + \frac{\sigma V^2 d_E}{2k_E d_O}\right)T_S + \frac{V^2 r_F^2}{8d_O^2 L_{WF}} = 0. \quad \text{(Eq. 8)}$$

FIG. 6A compares memristive switching data with the constitutive equations (Eqs. 7a, 7b), demonstrating excellent agreement between theory and experiment with the use of only three physical fitting parameters: $T_{crit}$, $k_E$, and $\sigma$ or $r_F$ (one determines the other via $R_F=d_O/\sigma\pi r_F^2$).

Only a single hysteresis loop is shown, however, this technique has successfully described a diverse set of samples, including a variety of device structures, oxide thicknesses, electrode materials, growth chambers and targets, and devices sizes. Importantly, the physical fitting parameters were found to all have quite reasonable ranges over our set of test devices: 8.5 nm<$r_{max}$<13.2 nm and $7.2\times10^4$ $\Omega^{-1}$ $m^{-1}$<$\sigma$<$3.8\times10^5$ $\Omega^{-1}m^{-1}$ are consistent with the range of previous reports (Miao F et al., "Continuous electrical tuning of the chemical composition of TaO$_x$-based memristors," *ACS Nano* 2012; 6(3):2312-8). $T_{crit}\approx$1300 K-1700 K is in close agreement with finite element thermal modeling (Strukov D B et al., *Appl. Phys. A* 2012; 107:509-18; and Strukov D B et al., *Appl. Phys. A* 2009; 94(3):515-9). 89 W $m^{-1}K^{-1}$<$k_E$<120 W $m^{-1}K^{-1}$ is close to the expected value for our electrodes. We also note here that our prediction of a minimum resistance state or $R_{min}$ is in quantitative agreement with previous experimental reports (Lohn A J et al., "Dynamics of percolative breakdown mechanism in tantalum oxide resistive switching," *Appl. Phys. Lett.* 2013; 103:173503).

Both the simplicity and quantitative power of the constitutive equations merit further discussion. Eqs. 7a-7b analytically determine, the arguably, four most important physical memristive parameters: filament composition $\sigma$, radius (using $\sigma$ and $R_E$), temperature $\Delta T$, and effective surrounding thermal resistance $k_E$. As described above, determining filament composition and radius are prohibitively difficult (r, $\sigma$) (Miao F et al., "Anatomy of a nanoscale conduction channel reveals the mechanism of a high-performance memristor," *Adv. Mater.* 2011 December; 23(47):5633-40; and Miao F et al., *ACS Nano* 2012; 6(3):2312-8) and require inaccessible experimental instrumentation (T, $k_E$) (Strukov D B et al., *Appl. Phys. A* 2012; 107:509-18; and Larentis S et al., *Microelectron. Eng.* 2011 July; 88(7):1119-23).

Filament temperature and the thermal resistance of the environment—outside of finite element methods such as COMSOL simulations—are all but unknown experimentally. In contrast, Eqs. 7a-7b achieve a complete characterization of the conducting filament algebraically using a single hysteresis curve. It is now possible for all researchers to rapidly and easily determine the effect of their experiments on the internal structure and behavior of the device.

FIG. 8a-d provides a physical depiction of the microscopic ionic flux in multiple switching regimes described by the constitutive equations of Eqs. 7a-7b. During ON switching ($V_+$ on top electrode) vacancies first flow in the hot filament center and "pile-up" at the bottom electrode interface due to the insolubility of $O^2$ in Pt (FIG. 8a). This process continues until the filament core reaches vacancy saturation.

Next, the vacancies have no choice but to flow toward the outer edges of the filament where the concentration is sub-saturation, provided there is sufficient Joule heating that $T_S$>$T_{crit}$ (see FIG. 8b). This process continues until the power requirements to reach $T_{crit}$ diverge as $R_F\to R_{min}$ (P$\to\infty$). During OFF switching ($V_-$ on top electrode), vacancy saturation no longer limits ion motion, and because Pt has no reservoir of vacancies, the filament is quasi-uniformly depleted as vacancies leave vertically without replacement from the bottom electrode (FIG. 8c). This process continues until all vacancies have left and $R_F\to R_{max}$. However, because OFF states are less resistive than virgin devices, it is highly likely that some permanent vacancy locations remain (FIG. 8d).

Eqs. 7a-7b also determined fundamental operational limits of filamentary memristors and provides quantitative insight into the optimization of device design and operation. As described above, the constitutive equations specify maximum and minimum, therefore, inspecting their analytical form we see that maximum OFF/ON ratios may be engineered directly:

$$\frac{R_{OFF}}{R_{ON}} \equiv \left[\frac{4\sigma L_{WF}T_{crit}d_od_E}{r_{max}^2 k_E}\right]^2. \quad \text{(Eq. 9)}$$

Figure 9:
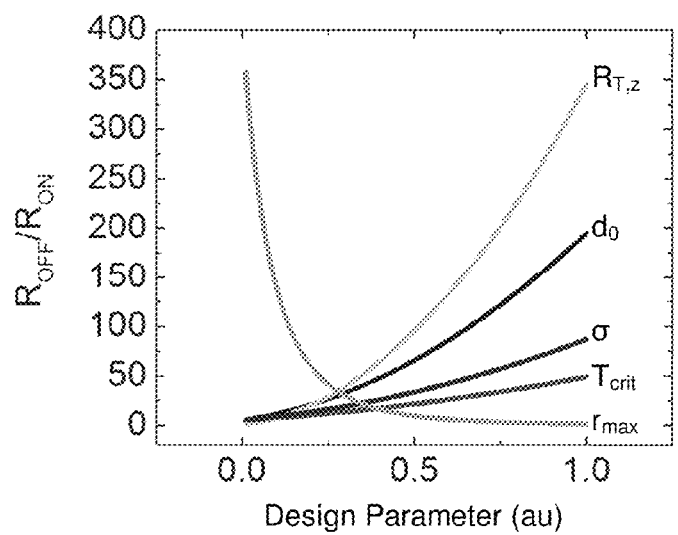
FIG. 9 is a graph showing design predictions for $R_{max}/R_{min}$ ratio. The effect on the $R_{max}/R_{min}$ ratio of varying multiple design parameters is shown. $T_{crit}$ was varied from 750 K to 2250 K, $d_O$ was varied from 5 nm to 20 nm, the vertical thermal resistance $R_{T,z}$ was varied from 0.25× to 4× its experimental value, $\sigma$ was varied from 0.5× to 2× its experimental value, and $r_{max}$ was varied from 5 nm to 20 nm. The $R_{max}/R_{min}$ ratio observed experimentally here was approximately $R_{max}/R_{min}$ ratio≈22.

A simple demonstration of the design power of these equations is shown in FIG. 9, where the influence of individual design parameters on the OFF/ON ratio are calculated. It should be noted that the plotted values show the ratio of maximum and minimum resistances and infinite power is required to reach both $R_{max}$ and $R_{min}$, however, it also true that design parameters are varied individually here, and that multidimensional design space could produce even larger OFF/ON ratios.

Power requirements are also of salient interest to circuit designers, and we note that the memristive constitutive equations presented here provide a framework to analytically calculate and design energy requirements for specific resistive switching ranges $R_{ON}$<R<$R_{OFF}$:

$$E_{cycle} = \oint_{R_{ON}}^{R_{OFF}} P(R)dR\frac{dt}{dR}. \quad \text{(Eq. 10)}$$

Additionally, though not discussed in detail here, Eqs. 7a-7b provide analytical and quantitative insight into multiple material properties and design factors, including: number of states per device, switching voltage ranges, read windows, the scaling limit, effects of fabrication tolerances on device variation, and even multiple filament detection.

In conclusion, we derived and experimentally verified a set of constitutive equations that govern filamentary memristive switching. These equations identified and explained the self-limiting thermal physics which controls both ON and OFF switching. We demonstrated that applying these equations to a single hysteresis loop allows any researcher with a voltage/current source meter to fully characterize the internal structure and behavior of the conducting filament, including its composition, radius, surrounding thermal resistance, and critical switching temperature. Most importantly, these constitutive equations provide a powerful and simple analytical framework with which to easily and accurately characterize and design devices, and with which to model their operation.

Example 3

Degenerate Resistive Switching and Ultrahigh Density Storage in Resistive Memory In this Example, we show that, in tantalum oxide resistive memories, activation power provides a multi-level variable for information storage that can be set and read separately from the resistance. These two state variables (resistance and activation power) can be precisely controlled in two steps: (1) the possible activation power states are selected by partially reducing resistance, then (2) a subsequent partial increase in resistance specifies the resistance state and the final activation power state. We show that these states can be precisely written and read electrically, making this approach potentially amenable for ultra-high density memories. We provide a theoretical explanation for information storage and retrieval from activation power and experimentally demonstrate information storage in a third dimension related to the change in activation power with resistance.

Moore's law, the exponential increase in transistor density, has been the driving force for an immense increase in memory density over the past decades (Moore G E, "Cramming more components onto integrated circuits," *Proc. of the IEEE* 1998 January; 86(1):82-5), but it has become increasingly difficult to continue, leading to a broad search for new approaches (Dieny B et al., *J. Phys. D: Appl. Phys.* 2013; 46(7):070301; Ielmini D, *Microelectron. Eng.* 2009 September-July; 86(7-9):1870-5; and Burr G W, *IBM J. Res. Develop.* 2008 July; 52(4.5):449-64).

Resistive memories (RRAM) are among the leading candidates to replace transistors for memory applications, in part, due to their ability to store information within a range of resistances instead of a digital ON or OFF (Yang J J et al., *Nat. Nanotechnol.* 2013 January; 8; 13-24; Kim H et al., 2010 *12th Int'l Workshop on Cellular Nanoscale Networks and Their Applications (CNNA)*, held on 3-5 Feb. 2010, in Berkeley, Calif., pp. 1-6; and Manem H et al., 2011 *IEEE Int'l Symposium on Circuits and Systems (ISCAS)*, held on 15-18 May 2011 in Rio de Janeiro, pp. 2938-41). The resistances are typically believed to change by varying either the radius or conductivity of a conducting filament (Nardi F et al., "Resistive switching by voltage-driven ion migration in bipolar RRAM—Part I: Experimental study," *IEEE Trans. Electron Devices* 2012 September; 59(9):2461-7; Mickel P R et al., *Appl. Phys. Lett.* 2013; 102:223502; and Miao F et al., *ACS Nano* 2012; 6(3):2312-8).

We show that by using partial SET followed by partial RESET operations, degenerate resistances can be created such that information can be stored in multiple states corresponding to the same resistance. Previous observations of degeneracy in resistive switching are very few and have been limited to only a single level of degeneracy. Devices using two inert electrodes were able to create a vertical concentration gradient to provide a single level of degeneracy for storage (Balatti S et al., "Multiple memory states in resistive switching devices through controlled size and orientation of the conductive filament," *Adv. Mater.* 2013; 25:1474-8). Additionally, a second turn-on voltage has been demonstrated for a single resistance value (Nardi F et al., *IEEE Trans. Electron Devices* 2012 September; 59(9):2461-7) but without a discussion of the potential for information storage.

Since RRAM requires Joule heating for thermal activation (Strukov D B et al., *Appl. Phys. A* 2012; 107:509-18; and Larentis S et al., *Microelectron. Eng.* 2011 July; 88(7):1119-23), the electrical power required to reach that activation threshold provides a separate state variable apart from resistance to store information. We experimentally demonstrate a simple electrical method for storing and extracting multiple activation power states at single resistance values. No changes are required to device design and, in principle, storing and extracting information in activation power states can be done simply. To compete with contemporary storage class memory however, new analog circuits will need to be developed to ensure, for example, speed and small footprint. Here, we focus on explaining information storage using multiple dimensions (i.e., resistance and power) and on demonstrating that, in principle, it can be used to store a very large number of states per device.

Experimental:

For experimental demonstration, we used standard CMOS-compatible tantalum oxide metal-insulator-metal devices (Lohn A J et al., *Appl. Phys. Lett.* 2013; 103:063502; and Lohn A J et al., *ECS Trans.* 2013; 58(5):59-65) with a reactive (tantalum) electrode, an inert (titanium nitride) electrode, and a 10 nm tantalum oxide layer deposited by feedback-controlled reactive sputtering (Stevens J E et al., "Reactive sputtering of substoichiometric $Ta_2O_x$ for resistive memory applications," *J. Vac. Sci. Technol. A* 2014 March/April; 32(2): 021501).

Derivation of READ Voltage:

During the SET process, the radius of the conducting filament increases once the oxygen vacancies reach a saturation concentration. Further increases occur once the outer edge of the filament reaches the activation temperature, and vacancies there become mobile enough to enter. As a result, the conductivity within the filament is approximately uniform throughout, and the SET voltage is the voltage required to achieve the activation temperature at the edge of the filament, where new vacancies can enter. In a subsequent negative polarity step, vacancy motion is not limited by saturation so vacancies can leave from any portion of the filament that reaches the activation temperature. This will occur at the center of the filament first and at a lower voltage than is required to reach activation at the filament edge.

Equations given in Larentis S et al., *Microelectron. Eng.* 2011; 88:1119-23, approximate the temperature profile within a cylindrical filament with uniform conductivity. Equations representing these temperature profiles are as follows:

for temperature at the edge, $$T_S = T_{RT} + \sigma V_{SET}^2 \frac{d_E}{2 k_E d_O}\left[1 - \frac{k_E}{k_F}\frac{r_F^2}{4 d_E d_O}\right]; \qquad \text{(Eq. 11)}$$

for temperature at every r within the filament, $$T(r) = \frac{\sigma V_{READ}^2 r_F^2}{4 d_O^2 k_F}\left(1 - \frac{r^2}{r_F^2}\right) + T_S; \qquad \text{(Eq. 12a)}$$

and for temperature at r=0, $$T(r=0) = \frac{\sigma V_{READ}^2 r_F^2}{4 d_O^2 k_F} + T_{RT} + \sigma V_{READ}^2 \frac{d_E}{2 k_E d_O}\left[1 - \frac{k_E}{k_F}\frac{r_F^2}{4 d_E d_O}\right]. \qquad \text{(Eq. 12b)}$$

Equating the temperature at the edge (SET process and Eq. 11) to the temperature at the center (READ process and Eqs. 12a-12b) relates the SET and READ voltages. Equating Eq. 11 and Eq. 12b, and then grouping terms, gave the following equations:

$$V_{READ}^2\left[\frac{\sigma r_F^2}{4 d_O^2 k_F} + \frac{\sigma d_E}{2 k_E d_O}\left[1 - \frac{k_E}{k_F}\frac{r_F^2}{4 d_E d_O}\right]\right] = \qquad \text{(Eq. 13)}$$

$$V_{SET}^2 \frac{\sigma d_E}{2 k_E d_O}\left[1 - \frac{k_E}{k_F}\frac{r_F^2}{4 d_E d_O}\right]$$

and $$V_{READ} = V_{SET} \sqrt{\frac{\frac{d_E}{k_E} - \frac{r_F^2}{4k_F d_O}}{\frac{d_E}{k_E} + \frac{r_F^2}{4k_F d_O}}}.$$ (Eq. 14)

Eq. 14 relates the voltage required to increase resistance to the voltage required to decrease the resistance for a cylindrical filament with uniform conductivity. For a filament that has already been partially depleted, the two values will be more similar due to negative feedback during the initial stages of OFF switching. Additionally, the temperature profile within the filament that was used in the preceding derivation ignores heat loss through the electrodes, causing an overestimate of the peak temperature at the center. Therefore, the difference between SET and READ voltages in Eq. 14 represents a maximum difference and should be thought of as limiting behavior that provides intuition in understanding the discrepancy between read and write.

DISCUSSION

From a physical point of view, the activation power and resistance are controlled by the radius and conductivity of the conducting filament (Mickel P R et al., "Isothermal switching and detailed filament evolution in memristive systems," *Adv. Mater.* 2014; 26:4486-90). The process is described in detail in three equivalent ways in FIG. 2A. The subfigures in the left column (FIG. 2A(i-iii)) show the structure of the conducting filament, illustrating its radius and vacancy concentration (effectively conductivity). The subfigures in the middle column (FIG. 2A(iv-vi)) show the same changes on a current-voltage hysteresis loop. The subfigures in the right column (FIG. 2A(vii-ix)) show the same current-voltage data mapped into power-resistance coordinates, which are the two dimensions where information is stored.

The electrical data can be directly converted between current-voltage and power-resistance coordinates via the following equations:

$P=IV$ (Eq. 15a) and $R=V/I$ (Eq. 15b).

The physical process occurring within the device during switching is described in Mickel P R et al., *Adv. Mater.* 2014; 26:4486-90, which is incorporated herein by reference in its entirety.

ON switching (resistance decrease) proceeds in two stages as follows. First, applying a positive current (inert electrode grounded) decreases resistance by injecting oxygen vacancies from the reactive electrode into a localized conducting filament (FIG. 2A(i, iv, vii)). Next, once the injected vacancies reach a saturation concentration, further increases in positive current cause the radius of the filament to increase (FIG. 2A(ii, v, viii)) because injected vacancies cannot exist above saturation. To continue increasing the radius, more power must be supplied. In this way, a desired filament radius can be specified by choosing a power limit. In practice, the power is typically limited by selecting a current limit for the electrical supply.

Once the radius is set, the conductivity can be set by applying the opposite polarity (negative on reactive electrode) to draw oxygen vacancies back into the reactive electrode, thereby increasing resistance (FIG. 2A (iii, vi, ix)). To continue decreasing conductivity, more power must be supplied. In that way, the final conductivity can be specified by selecting a power limit. In practice, the power is typically limited by setting a voltage limit. The ability to limit power by specifying a maximum voltage when resistance is increasing, and a maximum current when resistance is decreasing can be seen from the basic power relations and considering how the power supplied changes with changing resistance:

Power=$V^2/R=I^2R$ (Eq. 16).

This two-step process (positive current then negative voltage) can be used to set a desired resistance in many different degenerate radius-conductivity combinations. For example, starting with a large current limit, then reversing polarity and using a large voltage limit will create a conducting filament with a large radius but small conductivity. The device will therefore have an intermediate resistance value. But that same resistance could alternatively be achieved by a conducting filament with a small radius and large conductivity. To create the latter filament one would use a small positive current to set a small radius then use a small negative voltage to only reduce the conductivity by a small amount. These two configurations have the same resistance but are fundamentally different.

It is difficult to directly measure the composition of the nanoscale filaments embedded in electronic devices but fortunately, the electrical behavior allows an immediate test for degenerate configurations. Using the physical description outlined above, a filament with a larger radius allows more heat to escape through the electrodes than a smaller filament of the same resistance. This simplified description predicts that large radius devices will require more power to initiate switching. Since the electrical resistance and electrical power are trivial to measure, they provide an electrical method to verify the existence of degenerate resistance states.

These power-related effects can be seen in a current-voltage hysteresis loop, but they are much more clearly observed if that same data is transformed into power and resistance coordinates. Experimental data showing degenerate resistances is shown in FIG. 3A in power-resistance coordinates calculated using Eq. 16. For comparison to current-voltage data, the bottom left kink, labeled "Read 3", corresponds to 0.55V and 1.83 mA. Prior to each of the curves shown, the device was set to a specified degenerate resistance value by applying a controlled positive current followed by a controlled negative voltage. The intersections of the dotted lines show the resistance and power at the end of the SET process. This is the location of the stored data in both power and resistance dimensions. It is clear from FIG. 3A that these set points are degenerate in both resistance and power since there are two distinct power configurations for each resistance and there are two distinct resistances for each power.

In order to detect the configuration of the filament, the electrical power delivered to the device was progressively incremented while monitoring the resistance (moving upward along the solid curves). Once the activating power is reached, the resistance starts to change (the curve moves to the right). The kink in the curve is the READ location of the stored data. As seen in FIG. 3A, the locations of the kinks in the READ step are precise reproductions of the SET points (intersections of the dotted lines). The exception is the top left point, where the READ curve activates at too low a power and departs gradually instead of abruptly like the others. This effect will be discussed later.

In FIG. 3A, only four distinct states are shown, but both the resistance and power states can be set to a continuum of values. A schematic illustration of the range of possible degenerate values is shown in FIG. 4A, and an experimental demonstration is shown in FIG. 4B. In the experimental demonstration, each point is set by pulses in the positive direction followed by pulses in the negative direction as described above. For the purpose of visual clarity in our experimental demonstration, we only show approximately 100 states but it is apparent from FIG. 4B that much larger state densities are possible. Even at this state density per dimension, this single device addresses approximately seven (7) digital bits (i.e., $2^7$ states).

As depicted in FIG. 3A, the READ points (location of the kinks) are very good reproductions of the SET points (intersections of dotted lines), indicating that high densities of information storage may be possible. The density of digital bits that can be stored will likely be limited by noise in both the reading and writing steps. The writing noise can be addressed through closed-loop state setting, at expense of speed, if large densities are desired, but the reading noise is more difficult to control (Ambrogio S et al., "Understanding switching variability and random telegraph noise in resistive RAM," *IEEE Intl Electron Devices Meeting*, held on 9-11 Dec. 2013 in Washington, D.C., pp. 31.5.1-31.5.4; Terai Metal., "Memory-state dependence of random telegraph noise of $Ta_2O_5/Ti_2$ stack ReRAM," *IEEE Electron Devices Lett.* 2010 November; 31(11):1302-4; and Puglisi F M et al., "Random telegraph signal noise properties of HfOx RRAM in high resistive state," *Proc. of the Europ. Solid-State Devices Res. Conf.*, held on 17-21 September 2012 in Bordeaux, France, pp. 274-7).

Aside from noise effects, there can be a discrepancy between the SET and READ points in the high-power low-resistance regime (top left in the FIG. 3A). The early activation and more gradual resistance change is due to the shape of the thermal profile within the filament and can be described as follows. For a cylindrical filament, the temperature is highest in the center so a small segment of the cylinder near the center will become activated prematurely, allowing for early onset of resistance change. Since only a fraction of the filament is thermally activated, the resistance changes gradually.

The following equation relating the SET and READ voltages required to reach thermal activation for a cylindrical filament with uniform conductivity provides qualitative insight:

$$V_{READ} = V_{SET} \sqrt{\frac{\frac{d_E}{k_E} - \frac{r_F^2}{4k_F d_O}}{\frac{d_E}{k_E} + \frac{r_F^2}{4k_F d_O}}}, \quad \text{(Eq. 14)}$$

where $d_E$ and $d_O$ are the electrode and oxide thickness respectively, $k_E$ and $k_F$ are the electrode and filament thermal conductivity respectively, and $r_F$ is the filament radius.

Inspection of Eq. 14 shows that if the following inequality in Eq. 17 holds, then the READ voltage reduces to the SET voltage.

$$\frac{d_E}{k_E} \gg \frac{r_F^2}{4k_F d_o} \quad \text{(Eq. 17)}$$

In our devices, this simplifying approximation is not justified for all $r_F$ but it may be possible to alter design to meet this criterion. The most convenient approach to do so involves increasing the thermal resistance of the electrode. It should be noted that the above relation and simplifying assumption were derived by modeling the thermal resistance with $k_E$ and $d_E$ as continuum parameters to define electrode thermal resistance, but the vertical thermal resistance itself is the parameter of interest and may be dominated by interface and geometric spreading effects.

Even without device redesign, it is still possible to read and write at the same activation power over a wide range. The SET-READ discrepancy is due to a temperature profile that peaks in the center, but the temperature profile in the device spontaneously flattens during OFF switching due to the following negative feedback process. In the first stages of OFF switching, the temperature is highest at the center so the electrical conductivity is reduced there first. Current density is then decreased in the central region, causing core temperature to drop and surrounding temperature to rise. This negative feedback process continues with increased switching, naturally producing a conductivity profile that gives a flattened temperature profile. For a device with a flattened temperature profile, the entire filament activates simultaneously, just as it does for a small radius filament (see Eq. 14).

Devices with low activation power points correspond to small radii which, when considering the inequality expressed in Eq. 14, explains why the two low power points in FIG. 3A activate abruptly at exactly the SET power. The two high power points correspond to large radii where Eq. 14 is not justified, so the SET and READ powers are not necessarily identical but, as can be seen in FIG. 3AB, in the high resistance case (top right) they are the same despite the large radius. That is because, during the previous two-step SET process, the high resistance case underwent the negative feedback process described above to give a flattened temperature profile. This is an example of using electrical control to flatten the temperature profile in order to achieve abrupt switching at exactly the SET voltage. Using this technique, over a reduced range of states, the SET and READ powers will be identical with abrupt transitions in the activation power-resistance space, even without the modification for increased vertical thermal resistance.

Interestingly, the gradual resistance change in the high-power low-resistance (top left) case in FIG. 3A hints at the existence of a third dimension for information storage. The slope that is traversed through power-resistance space upon activation can be a tunable parameter apart from activation power and resistance themselves. For this third dimension, the SET process requires an additional step.

Once the device has been set to a two-dimensional state, applying a small positive polarity power that is only sufficient to activate the filament locally in the center will increase the conductivity of the filament in the center, leaving the surrounding regions unchanged. The conductivity of this inner filament can then be reduced with a small negative polarity power. By providing an oscillating signal of partial ON and OFF half cycles, it is possible to create a gradient of conductivities instead of a uniform cylindrical geometry as discussed previously.

Various conductivity profiles can be created to have the same resistance and activation power states but with non-cylindrical conductivity profiles. Once sufficient electrical power is supplied, their resistance will change but so will their conductivity profile. As their conductivity profile changes, so will their activation power. Changes in the activation power during switching cause these different configurations to follow different paths through resistance-power space that can be detected separately from the resistance and activation power themselves.

An experimental example of degeneracy in both power and resistance is depicted schematically in FIG. 4A and experimentally in FIG. 4B, where a device was configured to have the same activation power and resistance but different paths through power-resistance space. Equivalently, the state variables can be thought of as conductivity, radius, and slope of the filament's conductivity profile. Since the switching begins at the same resistance and power point, the varied slopes represent a third dimension for information storage. It is easy to envision that controlling the curvature or other aspects of the path could present still additional dimensions that can all be SET and READ electrically.

For a quasi-uniform conductivity, the radial temperature profile of a filament may be approximated as follows:

$$T(r) = T_{RT} + \frac{\sigma V^2 d_E}{2 k_E d_O} \left[ 1 + \frac{k_E}{k_F} \frac{r_F^2 - 2r^2}{4 d_E d_O} \right],$$  (Eq. 18)

where $T_{RT}$ is room-temperature, V is the applied voltage, and r is a radial point within the radius of the filament $r_F$. At sufficient applied power, the temperature inside the filament will cross the thermal activation threshold and ionic vacancy flow will occur.

FIG. 4B shows the resulting P-R switching curves for higher-order hysteresis cycles. The high-order states are created by repeated hysteresis cycling with decreasing power endpoints, where the initial end points and number of cycles used to approach zero power determine the resulting P-R slope. Without wishing to be limited by theory, these P-R trajectories likely result from the development of specific radial conductivity profiles, where these profiles can be fit or simulated with any useful model, e.g., employing Eq. 18.

The upper inset of FIG. 4B shows simulated P-R switching curves for the conductivity profiles shown in the lower inset of FIG. 4B. The simulated switching curves are in strong qualitative agreement with the experimental switching curves, with quantitatively similar resistances, activation points, and slopes. This provided compelling support that the experimental P-R switching curves are the result of tunable radial conductivity profiles.

Finally, it is important to discuss the implications of designing/creating specific conductivity profiles in memristive devices. Multi-bit information storage is one of the most intriguing applications for resistive switching (Yu S et al., "Investigating the switching dynamics and multilevel capability of bipolar metal oxide resistive switching memory," Appl. Phys. Lett. 2011; 98:103514). However, it requires fine tune control of resistive switching, which can be challenging. Switching curve (1) in FIG. 5B shows strong sensitivity to negative polarity power, where resistance values rise quickly once the activating power dose is applied. As seen, a small noise signal in the applied power $\delta P_1$ results in a very large change in resistance. In contrast, by ensuring a sloped P-R trajectory by designing radial conductivity profiles (such as (2) and (3) in the lower inset of FIG. 5B), the noise fluctuations required to give the same spurious δR are substantially increased (see $\delta P_2$ and $\delta P_3$ in FIG. 5B).

Control over conductivity profiles also allow power thresholds to be proactively set. This ability could lead to resilience to half-select write errors, where voltages/currents of neighboring devices in crossbar arrays are exposed to signals which gradual change their state over time (Lohn A J et al., J. Appl. Phys. 2014; 115:234507). Alternatively, this functionality could also be used to intentionally set low or high power thresholds, allowing different devices to emulate short-term and long-term memory for neuromorphic computation (Chang T et al., "Short-term memory to long-term memory transition in a nanoscale memristor," ACS Nano 2011; 5(9): 7669-76; and Indiveri G et al., "Integration of nanoscale memristor synapses in neuromorphic computing architectures," Nanotechnology 2013; 24(38):384010).

The ability to store and retrieve information in activation power as well as resistance was demonstrated experimentally and explained theoretically. The approach for writing and reading these variables requires only two steps to achieve the two dimensions. A positive polarity step was used to set the filament radius (effectively determining the power-state), and a negative polarity step was used to set the filament conductivity (effectively determining the resistance state). Storage in this multi-dimensional information space drastically increases the available state density of these devices without changes in device design.

Other Embodiments

All publications, patents, and patent applications, including U.S. Provisional Application No. 61/866,690, filed Aug. 16, 2013, mentioned in this specification are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. A method for storing information in a first resistive memory device having a reactive electrode, the method comprising:
   with positive polarity on the reactive electrode, applying electric power to the first device in a first sweep until a first desired stopping point $P_{R1}$ is reached; and
   then with negative polarity on the reactive electrode, applying electric power to the first device in a second sweep until a first desired set point $P_{C1}$ is reached,
   thereby providing a first filament within the first device, wherein the first filament is characterized by a state having a plurality of state variables, wherein at least one of the state variable is established by $P_{R1}$ and/or $P_{C1}$,
   wherein $P_{R1}$ establishes a first filament radius $r_1$ as one state variable and $P_{C1}$ establishes a first conductivity $\sigma_1$ as a second state variable, and
   wherein a combination of state variables $<r_1, \sigma_1>$ corresponds to a $(R_1, P_1)$ storage coordinate, $R_1$ denotes a resistance of the first device, and $P_1$ denotes an applied power needed to begin changing the resistance of the first device.

2. The method of claim 1, wherein the first sweep is current limited and the second sweep is voltage limited.

3. The method of claim 1, wherein each of the first sweep and the second sweep is power-controlled.

4. The method of claim 1, wherein $P_{R1}$ of the first sweep determines which (R,P) storage coordinates will be accessible in the second sweep.

5. The method of claim 1, wherein each of $P_{R1}$ and $P_{C1}$, together, establishes a first power-resistance angle $\theta_1$ as a third state variable, wherein $\theta_1$ denotes a slope of δP/δR.

6. The method of claim 1, further comprising:
reading the state of the first filament.

7. The method of claim 6, wherein the reading step comprises:
performing a sweep of applied power $P_{app}$ to the first device and
monitoring a resistance of the device during the sweep, wherein a change in resistance is indicated as the resistance setpoint $R_{sp}$.

8. The method of claim 7, wherein $P_{app}$ corresponds to $P_1$ and $R_{sp}$ corresponds to $R_1$.

9. The method of claim 1, wherein the method further comprises storing information in a second resistive memory device having a reactive electrode.

10. The method of claim 9, further comprising:
with positive polarity on the reactive electrode, applying electric power to the second device in a third sweep until a second desired stopping point $P_{R2}$ is reached; and
then with negative polarity on the reactive electrode, applying electric power to the second device in a fourth sweep until a second desired set point $P_{C2}$ is reached,
thereby providing a second filament within the second device, wherein the second filament is characterized by a state having a plurality of state variables, and wherein at least one state variable is established by $P_{R2}$ and/or $P_{C2}$.

11. The method of claim 10, wherein $P_{R2}$ establishes a second filament radius $r_2$ as one state variable, $P_{C1}$ establishes a second conductivity $\sigma_2$ as a second state variable, and/or wherein the combination of $P_{R2}$ and $P_{C1}$ establishes a second power-resistance angle $\theta_2$ as the third state variable.

12. The method of claim 11, wherein a combination of state variables $\langle r_2, \sigma_2, \theta_2 \rangle$ corresponds to a $(R_2, P_2, \delta P_2/\delta R_2)$ storage coordinate, $R_2$ denotes a resistance of the second device, and $P_2$ denotes an applied power needed to begin changing the resistance of the second device, and $\delta P_2/\delta R_2$ denotes a slope of a change in applied power over a change in resistance.

13. The method of claim 12, wherein $R_1 \neq R_2$ and/or $P_1 \neq P_2$.

14. The method of claim 12, wherein $R_1 = R_2$ or $P_1 = P_2$.

15. A resistive memory device made by a process comprising the method of claim 1.

16. A memory comprising a plurality of m resistive memory devices, wherein each said device contains a respective stored data value embodied in a set of two or more state variables;
wherein the state variables include a combination of state variables $\langle r_n, \sigma_n \rangle$ for each $n^{th}$ filament in each $m^{th}$ device, $r_n$ denotes a filament radius for the $n^{th}$ filament, and $\sigma_n$ denotes a conductivity for the $n^{th}$ filament; and
wherein each $\langle r_n, \sigma_n \rangle$ corresponds to a $(R_n, P_n)$ storage coordinate, $R_n$ denotes a resistance of the $m^{th}$ device comprising the $n^{th}$ filament, and $P_n$ denotes an applied power needed to begin changing the resistance of the $m^{th}$ device comprising the $n^{th}$ filament.

17. The memory of claim 16, wherein the state variables include a combination of $\langle r_n, \sigma_n, \theta_n \rangle$ for each $n^{th}$ filament in each $m^{th}$ device and $\theta_n$ denotes a power-resistance angle for the $n^{th}$ filament; and
wherein each $\langle r_n, \sigma_n, \theta_n \rangle$ corresponds to a $(R_n, P_n, \delta P_n/\delta R_n)$ storage coordinate and $\delta P_n/\delta R_n$ denotes a slope of a change in applied power over a change in resistance for the $n^{th}$ filament.

18. A method for storing information in a first resistive memory device having a reactive electrode, the method comprising:
with positive polarity on the reactive electrode, applying electric power to the first resistive memory device in a first sweep until a first desired stopping point $P_{R1}$ is reached; and
with negative polarity on the reactive electrode, applying electric power to the first resistive memory device in a second sweep until a first desired set point $P_{C1}$ is reached,
wherein $P_{R1}$ establishes a first filament radius $r_1$ as one state variable and $P_{C1}$ establishes a first conductivity $\sigma_1$ as a second state variable, and
wherein a combination of state variables $\langle r_1, \sigma_1 \rangle$ corresponds to a $(R_1, P_1)$ storage coordinate, $R_1$ denotes a resistance of the first device, and $P_1$ denotes an applied power needed to begin changing the resistance of the first device.

19. The method of claim 18, wherein the first sweep is current limited and the second sweep is voltage limited.

20. The method of claim 18, wherein each of the first sweep and the second sweep is power-controlled.

* * * * *